United States Patent
Liu et al.

(10) Patent No.: US 9,093,368 B2
(45) Date of Patent: Jul. 28, 2015

(54) NONVOLATILE MEMORY CELLS AND ARRAYS OF NONVOLATILE MEMORY CELLS

(71) Applicant: Micron Technology, Inc., Boise, ID (US)

(72) Inventors: Zengtao T. Liu, Boise, ID (US); David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 13/950,026

(22) Filed: Jul. 24, 2013

(65) Prior Publication Data

US 2013/0306933 A1 Nov. 21, 2013

Related U.S. Application Data

(62) Division of application No. 13/010,048, filed on Jan. 20, 2011, now Pat. No. 8,791,447.

(51) Int. Cl.
*H01L 29/06* (2006.01)
*H01L 27/24* (2006.01)
*G11C 5/02* (2006.01)
*H01L 45/00* (2006.01)

(52) U.S. Cl.
CPC .............. *H01L 27/2409* (2013.01); *G11C 5/02* (2013.01); *H01L 27/249* (2013.01); *H01L 45/08* (2013.01); *H01L 45/085* (2013.01); *H01L 45/1226* (2013.01); *H01L 45/142* (2013.01); *H01L 45/143* (2013.01); *H01L 45/145* (2013.01); *H01L 45/146* (2013.01); *H01L 45/147* (2013.01)

(58) Field of Classification Search
CPC ... H01L 45/1608; H01L 45/08; H01L 45/085; H01L 45/1233; H01L 45/14; H01L 45/142; H01L 45/143; H01L 45/144; H01L 45/145; H01L 45/146; H01L 45/147; H01L 45/16; H01L 45/1616; H01L 27/2409; H01L 27/2463; H01L 27/2472; H01L 27/2481
See application file for complete search history.

(56) References Cited

U.S. PATENT DOCUMENTS

| 4,715,685 | A | 12/1987 | Yaniv et al. |
| 4,964,080 | A | 10/1990 | Tzeng |
| 5,049,970 | A | 9/1991 | Tanaka et al. |
| 5,122,476 | A | 6/1992 | Fazan et al. |

(Continued)

FOREIGN PATENT DOCUMENTS

| CN | 1444284 | 9/2003 |
| CN | 1459792 | 12/2003 |

(Continued)

OTHER PUBLICATIONS

U.S. Appl. No. 12/701,885, filed Feb. 8, 2010, Sandhu et al.

(Continued)

*Primary Examiner* — Vongsavanh Sengdara
(74) *Attorney, Agent, or Firm* — Wells St. John, P.S.

(57) ABSTRACT

A nonvolatile memory cell includes first and second electrodes. Programmable material and a select device are received in series between and with the first and second electrodes. Current conductive material is in series between and with the programmable material and the select device. An array of vertically stacked tiers of such nonvolatile memory cells is disclosed. Methods of forming arrays of nonvolatile memory cells are disclosed.

22 Claims, 29 Drawing Sheets

(56) References Cited

U.S. PATENT DOCUMENTS

| | | | |
|---|---|---|---|
| 6,218,696 B1 | 4/2001 | Radius | |
| 6,432,767 B2 | 8/2002 | Torii et al. | |
| 6,524,867 B2 | 2/2003 | Yang et al. | |
| 6,552,952 B2 | 4/2003 | Pascucci | |
| 6,687,147 B2 | 2/2004 | Frickie et al. | |
| 6,693,821 B2 | 2/2004 | Hsu et al. | |
| 6,693,846 B2 | 2/2004 | Fibranz | |
| 6,717,881 B2 | 4/2004 | Ooishi | |
| 6,753,561 B1 | 6/2004 | Rinerson et al. | |
| 6,753,562 B1 | 6/2004 | Hsu et al. | |
| 6,757,188 B2 | 6/2004 | Perner et al. | |
| 6,778,421 B2 | 8/2004 | Tran | |
| 6,785,159 B2 | 8/2004 | Tuttle | |
| 6,806,531 B1 | 10/2004 | Chen et al. | |
| 6,834,008 B2 | 12/2004 | Rinerson et al. | |
| 6,873,544 B2 | 3/2005 | Perner et al. | |
| 6,905,937 B2 | 6/2005 | Hsu et al. | |
| 6,930,324 B2 | 8/2005 | Kowalski et al. | |
| 6,940,113 B2 | 9/2005 | Hsu et al. | |
| 6,946,702 B2 | 9/2005 | Jang | |
| 6,950,369 B2 | 9/2005 | Kunikiyo et al. | |
| 6,955,992 B2 | 10/2005 | Zhang et al. | |
| 6,958,273 B2 | 10/2005 | Chen et al. | |
| 6,961,258 B2 | 11/2005 | Lowrey | |
| 6,970,375 B2 | 11/2005 | Rinerson et al. | |
| 6,972,211 B2 | 12/2005 | Hsu et al. | |
| 6,985,374 B2 | 1/2006 | Yamamura | |
| 7,002,197 B2 | 2/2006 | Perner et al. | |
| 7,005,350 B2 | 2/2006 | Walker et al. | |
| 7,009,278 B2 | 3/2006 | Hsu | |
| 7,026,911 B2 | 4/2006 | Aono et al. | |
| 7,029,924 B2 | 4/2006 | Hsu et al. | |
| 7,029,925 B2 | 4/2006 | Celii et al. | |
| 7,035,141 B1 | 4/2006 | Tripsas et al. | |
| 7,050,316 B1 | 5/2006 | Lin et al. | |
| 7,067,862 B2 | 6/2006 | Rinerson et al. | |
| 7,085,167 B2 | 8/2006 | Lee et al. | |
| 7,109,544 B2 | 9/2006 | Schloesser et al. | |
| 7,123,535 B2 | 10/2006 | Kurotsuchi et al. | |
| 7,149,108 B2 | 12/2006 | Rinerson et al. | |
| 7,167,387 B2 | 1/2007 | Sugita et al. | |
| 7,180,160 B2 | 2/2007 | Ferrant et al. | |
| 7,187,201 B1 | 3/2007 | Trimberger | |
| 7,193,267 B2 | 3/2007 | Hsu et al. | |
| 7,205,238 B2 | 4/2007 | Pan et al. | |
| 7,233,024 B2 | 6/2007 | Scheuerlein et al. | |
| 7,236,389 B2 | 6/2007 | Hsu | |
| 7,247,876 B2 | 7/2007 | Lowrey | |
| 7,273,791 B2 | 9/2007 | Basceri et al. | |
| 7,323,349 B2 | 1/2008 | Hsu et al. | |
| 7,388,775 B2 | 6/2008 | Bedeschi et al. | |
| 7,393,785 B2 | 7/2008 | Uhlenbrock et al. | |
| 7,405,967 B2 | 7/2008 | Kozicki et al. | |
| 7,459,715 B2 * | 12/2008 | Toda et al. ................... 257/2 | |
| 7,465,675 B2 | 12/2008 | Koh | |
| 7,473,982 B2 | 1/2009 | Aono et al. | |
| 7,489,552 B2 | 2/2009 | Kurotsuchi et al. | |
| 7,525,410 B2 | 4/2009 | Aono et al. | |
| 7,538,338 B2 | 5/2009 | Rinerson et al. | |
| 7,544,987 B2 | 6/2009 | Lu et al. | |
| 7,557,424 B2 | 7/2009 | Wong et al. | |
| 7,560,815 B1 | 7/2009 | Vaartstra et al. | |
| 7,570,511 B2 | 8/2009 | Cho et al. | |
| 7,639,523 B2 | 12/2009 | Celinska et al. | |
| 7,671,417 B2 | 3/2010 | Yoshida et al. | |
| 7,679,812 B2 | 3/2010 | Sasagawa et al. | |
| 7,687,793 B2 | 3/2010 | Harshfield et al. | |
| 7,687,840 B2 | 3/2010 | Shinmura | |
| 7,696,077 B2 | 4/2010 | Liu | |
| 7,700,935 B2 | 4/2010 | Kim et al. | |
| 7,727,908 B2 | 6/2010 | Ahn et al. | |
| 7,751,163 B2 | 7/2010 | Duch et al. | |
| 7,755,076 B2 | 7/2010 | Lung | |
| 7,768,812 B2 | 8/2010 | Liu | |
| 7,772,580 B2 | 8/2010 | Hofmann et al. | |
| 7,777,215 B2 | 8/2010 | Chien et al. | |
| 7,799,672 B2 | 9/2010 | Hashimoto et al. | |
| 7,838,861 B2 | 11/2010 | Klostermann | |
| 7,842,991 B2 | 11/2010 | Cho et al. | |
| 7,864,568 B2 | 1/2011 | Fujisaki et al. | |
| 7,898,839 B2 | 3/2011 | Aoki | |
| 7,907,436 B2 | 3/2011 | Maejima et al. | |
| 7,910,909 B2 | 3/2011 | Kim et al. | |
| 7,948,784 B2 | 5/2011 | Kajigaya | |
| 7,990,754 B2 | 8/2011 | Azuma et al. | |
| 8,021,897 B2 | 9/2011 | Sills et al. | |
| 8,043,926 B2 | 10/2011 | Cho et al. | |
| 8,048,755 B2 | 11/2011 | Sandhu et al. | |
| 8,094,477 B2 | 1/2012 | Maejima | |
| 8,098,520 B2 | 1/2012 | Seigler et al. | |
| 8,106,375 B2 | 1/2012 | Chen et al. | |
| 8,124,968 B2 | 2/2012 | Koo et al. | |
| 8,154,908 B2 | 4/2012 | Maejima et al. | |
| 8,154,909 B2 | 4/2012 | Azuma et al. | |
| 8,295,077 B2 | 10/2012 | Murooka | |
| 8,411,477 B2 | 4/2013 | Tang et al. | |
| 8,436,414 B2 | 5/2013 | Tanaka et al. | |
| 8,536,556 B2 | 9/2013 | Fukumizu | |
| 8,537,592 B2 | 9/2013 | Liu | |
| 8,542,513 B2 | 9/2013 | Tang et al. | |
| 8,563,228 B2 | 10/2013 | Sills et al. | |
| 8,611,121 B2 | 12/2013 | Ahn et al. | |
| 8,791,447 B2 | 7/2014 | Liu et al. | |
| 2002/0018355 A1 | 2/2002 | Johnson et al. | |
| 2002/0034117 A1 | 3/2002 | Okazawa | |
| 2002/0079524 A1 | 6/2002 | Dennison | |
| 2002/0196695 A1 | 12/2002 | Pascucci | |
| 2003/0031047 A1 | 2/2003 | Anthony et al. | |
| 2003/0174042 A1 | 9/2003 | Aono et al. | |
| 2003/0174570 A1 | 9/2003 | Ooishi | |
| 2003/0218902 A1 | 11/2003 | Perner et al. | |
| 2003/0218929 A1 | 11/2003 | Fibranz | |
| 2003/0223283 A1 | 12/2003 | Kunikiyo | |
| 2004/0002186 A1 | 1/2004 | Vyvoda et al. | |
| 2004/0090841 A1 | 5/2004 | Perner et al. | |
| 2004/0100835 A1 | 5/2004 | Sugibayashi et al. | |
| 2004/0108528 A1 | 6/2004 | Hsu et al. | |
| 2004/0124407 A1 | 7/2004 | Kozicki et al. | |
| 2004/0245547 A1 | 12/2004 | Stipe | |
| 2005/0001257 A1 | 1/2005 | Schloesser et al. | |
| 2005/0014325 A1 | 1/2005 | Aono et al. | |
| 2005/0032100 A1 | 2/2005 | Heath et al. | |
| 2005/0054119 A1 | 3/2005 | Hsu et al. | |
| 2005/0128799 A1 | 6/2005 | Kurotsuchi et al. | |
| 2005/0161747 A1 | 7/2005 | Lung et al. | |
| 2005/0174835 A1 | 8/2005 | Rinerson et al. | |
| 2005/0180248 A1 | 8/2005 | Scheuerlein | |
| 2005/0205943 A1 | 9/2005 | Yamada | |
| 2005/0243844 A1 | 11/2005 | Aono et al. | |
| 2005/0250281 A1 | 11/2005 | Ufert et al. | |
| 2005/0269646 A1 | 12/2005 | Yamada | |
| 2005/0287741 A1 | 12/2005 | Ding | |
| 2006/0035451 A1 | 2/2006 | Hsu | |
| 2006/0046509 A1 | 3/2006 | Gwan-Hyeob | |
| 2006/0062049 A1 | 3/2006 | Lee et al. | |
| 2006/0097238 A1 | 5/2006 | Breuil et al. | |
| 2006/0099813 A1 | 5/2006 | Pan et al. | |
| 2006/0104111 A1 | 5/2006 | Tripsas et al. | |
| 2006/0110878 A1 | 5/2006 | Lung et al. | |
| 2006/0160304 A1 | 7/2006 | Hsu et al. | |
| 2006/0170027 A1 | 8/2006 | Lee et al. | |
| 2006/0171200 A1 | 8/2006 | Rinerson et al. | |
| 2006/0181920 A1 | 8/2006 | Ufert | |
| 2006/0215445 A1 | 9/2006 | Baek et al. | |
| 2006/0258079 A1 | 11/2006 | Lung et al. | |
| 2006/0274593 A1 | 12/2006 | Kurotsuchi et al. | |
| 2006/0284242 A1 | 12/2006 | Jo | |
| 2006/0286709 A1 | 12/2006 | Lung et al. | |
| 2007/0010082 A1 | 1/2007 | Pinnow et al. | |
| 2007/0015330 A1 | 1/2007 | Li et al. | |
| 2007/0019923 A1 | 1/2007 | Sasagawa et al. | |
| 2007/0034848 A1 | 2/2007 | Liu | |
| 2007/0041235 A1 | 2/2007 | Inoue | |
| 2007/0045615 A1 | 3/2007 | Cho et al. | |

(56) References Cited

U.S. PATENT DOCUMENTS

| | | |
|---|---|---|
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1* | 6/2007 | Stipe .......................... 257/421 |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz de Araujo et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0232160 A1 | 9/2008 | Gopalakrishnan |
| 2008/0247219 A1 | 10/2008 | Choi et al. |
| 2008/0251779 A1 | 10/2008 | Kakosehke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0141547 A1 | 6/2009 | Jin et al. |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1* | 10/2009 | Kim et al. .......................... 257/4 |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0046273 A1 | 2/2010 | Azuma et al. |
| 2010/0065836 A1 | 3/2010 | Lee et al. |
| 2010/0072452 A1* | 3/2010 | Kim et al. .......................... 257/4 |
| 2010/0084491 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0176368 A1* | 7/2010 | Ko et al. .......................... 257/5 |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2010/0259960 A1* | 10/2010 | Samachisa .......................... 365/51 |
| 2010/0259961 A1* | 10/2010 | Fasoli et al. .......................... 365/51 |
| 2010/0259962 A1 | 10/2010 | Yan et al. |
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0261606 A1 | 10/2011 | Sandhu et al. |
| 2011/0261607 A1 | 10/2011 | Tang et al. |
| 2012/0140542 A1 | 6/2012 | Liu |
| 2012/0147648 A1* | 6/2012 | Scheuerlein .......................... 365/51 |
| 2012/0164798 A1 | 6/2012 | Sills et al. |
| 2012/0187363 A1 | 7/2012 | Liu et al. |
| 2012/0248399 A1* | 10/2012 | Sasago et al. .......................... 257/4 |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 101546602 | 9/2009 |
| CN | 200880124714.6 | 7/2012 |
| CN | 201180027954.6 | 5/2014 |
| EP | 1796103 | 9/2006 |
| EP | 11792836 | 12/2013 |
| EP | 11845727.4 | 11/2014 |
| EP | 11834802 | 3/2015 |
| JP | 2005175457 | 6/2005 |
| JP | 2005-353779 | 12/2005 |
| JP | 2006032729 | 2/2006 |
| JP | 2006040981 | 2/2006 |
| JP | 2006074028 | 3/2006 |
| JP | 2006121044 | 5/2006 |
| JP | 2008-192995 | 8/2008 |
| JP | 2009-081251 | 4/2009 |
| JP | 2009-163867 | 7/2009 |
| JP | 2009-267411 | 11/2009 |
| JP | 2010-009669 | 1/2010 |
| JP | 2010-010688 | 1/2010 |
| JP | 2010-192569 | 9/2010 |
| JP | 2010-192646 | 9/2010 |
| JP | 2010-232214 | 10/2010 |

(56) References Cited

FOREIGN PATENT DOCUMENTS

| | | |
|---|---|---|
| JP | 2010-263211 | 11/2010 |
| KR | 2005-0008353 | 1/2005 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 20100078808 | 7/2010 |
| KR | 20100083402 | 7/2010 |
| TW | 097147549 | 5/2013 |
| TW | 100119681 | 8/2013 |
| TW | 100135681 | 10/2013 |
| TW | 100142963 | 8/2014 |
| TW | 101102280 | 8/2014 |
| WO | WO 2006/003620 | 1/2006 |
| WO | WO 2008-029446 | 3/2008 |
| WO | PCT/US2008/084422 | 3/2009 |
| WO | WO 2009/127187 | 10/2009 |
| WO | WO 2010/068221 | 6/2010 |
| WO | 2010/082922 | 7/2010 |
| WO | PCT/US2008/084422 | 7/2010 |
| WO | WO 2009/127187 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2010-117911 | 10/2010 |
| WO | PCT/US11/035601 | 11/2011 |
| WO | PCT/US2011/051785 | 4/2012 |
| WO | PCT/US2011/059095 | 5/2012 |
| WO | PCT/US12/021168 | 7/2012 |
| WO | PCT/US2011/066770 | 9/2012 |
| WO | PCT/US11/035601 | 12/2012 |
| WO | PCT/US2011/051785 | 4/2013 |
| WO | PCT/US2011/059095 | 6/2013 |
| WO | PCT/US2011/066770 | 7/2013 |

OTHER PUBLICATIONS

U.S. Appl. No. 12/765,598, filed Apr. 22, 2010, Sandhu et al.
U.S. Appl. No. 12/959,015, filed Dec. 2, 2010, Liu.
U.S. Appl. No. 12/979,189, filed Dec. 27, 2010, Sills et al.
U.S. Appl. No. 13/010,048, filed Jan. 20, 2011, Liu et al.
U.S. Appl. No. 12/014,232, filed Jan. 15, 2008, Liu.
U.S. Appl. No. 12/099,267, filed Apr. 8, 2008, Smythe et al.
U.S. Appl. No. 12/114,096, filed May 2, 2008, Srinivasan et al.
U.S. Appl. No. 12/141,388, filed Jun. 18, 2008, Liu.
U.S. Appl. No. 12/141,559, filed Jun. 18, 2008, Sandhu et al.
U.S. Appl. No. 12/166,604, filed Jul. 2, 2008, Sinha et al.
U.S. Appl. No. 12/765,506, filed Apr. 22, 2010, Tang et al.
Baek et al., "Multi-Layer cross-point Binary Oxide resistive Memory (OxRRAM) for Post-NAND Storage Application", IEEE, 2005.
Bedeschl et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al., Peroskite RRAM Devices with Metal/Insulator/PCMO/Metal Heterostructures, 2005; pp. 125-128.
Choi et al., "Defect Structure and Electrical Properties of single-Crystal Ba0.03SR0.97TiO3", J. Am Ceram. Soc., 71, [4], pp. 201-205, 1988.
Courtade et al., "Microstructure and resistance switching in NiO binary oxide films obtained from Ni oxidation", IEEE, 2006, pp. 94-99.
Higaki et al.; Effects of Gas Phase Absorption into Si Substrates on Plasma doping Process; Jan. 2004; A208.
Ho et al., "A Highly Reliable Self-=Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology", Advanced Materials Res. Lab, Japan; Correlated Electron Res. Center (CERC), Japan; Nanotechnology Res. Inst. (NRI), Japan, Dec. 2006; 4 pages.
Hudgens et al., "Overview of Phase-Change Chalcogenide Nonvolatile Memory Technology", MRS Bulletin, Nov. 2004, pp. 829-832.
Ignatiev et al., "Resistance Non-volatile Memory-RRAM", Mater. Res. Soc. Symp. Proc., vol. 997; 2007, Materials Research Society, 9 pages.
Karg et al., "Nanoscale REsistive Memory Device using SrRiO3 Films", IEEE, 2007, pp. 68-70.
Kau et al., "A Stackable cross point phase change memory", IEEE, 2009, pp. 27.1.1-27.1.4.
Komori et al., Disturbless flash memory due to high boost efficiency on BiCS structure and optimal memory film stack for ultra high density storage device; Dec. 2008; pp. 851-854.
Kooij et al., "Photoselective Metal Deposition on Amorphous Silicon p-i-n Solar Cells", Electrochemical Society Letters, Journal of Electrochemical Society vol. 44, No. 10, Oct. 1997, pp. L271-L272.
Kozicki et al., "Non-Volatile Memory Based on Solid Electrolytes", Center for Solid State Electronics Research, Arizona State University, Nov. 2004; 8 pp.
Kozicki, "Memory Devices Based on Solid Electrolytes", Mater. Res, Soc. Symp, Proc., vol. 997, 2007, Materials Research Society, 10 pages.
Lee et al,, "2-stack 1D-1R Cross-Point Structure with Oxide Diodes as Switch Elements for High Density Resistance RAM Applications"; IEE, 2007, pp. 771-774.
Lee et al., "Resistance Switching of Al doped ZnO for Non-Volatile Memory Applications"; Dept. of Materials Science and Engineering, Gwangju Institute of Science and Technology, May 2006; 2 pp.
Lin et al., "Effect of Top Electrode Material on REsistive Switching Properties of ZrO2 Film Memory Devices", May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual-Damascene (PMDD) for 0.13 um DRAMs and Beyond", IEEE, 2000, pp. 15.4-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006, IEEE, 4 pages.
Pein et al., "Performance of the 3-D Pencil Flash EPROM Cell and Memory Array", IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages.
Pirovano et al., "Self-Aligned u Trench Phase-Change Memory Cell Architecture for 90nm Technology and Beyond", IEEE, 2007, pp. 222-225.
Programmable metallization cell, Dec. 11, 2007; http://en.wikipedia.org/wiki/Programmable_metallization_cell on Dec. 13, 2011.
Scheck et al., "Selective Metal Electrodeposition Through Doping Modulation of Semiconductor Surfaces". Applied Physics Letters 86, 2005, 3 pgs.
Wikipedia, Despotuli et al., "Programmable Metallization Cell", pp. 1-4, Dec. 11, 2007, Place of Publication: Internet.
Wuttig, "Towards a Universal Memory?", Nature Materials, vol. 4, Apr. 2005, pp. 265-266.
Xing et al., "Characterization of AlGaN/GaN p-n Diodes with Selectively Regrown n-AlGaN by Metal-Organic Chemical-Vapor Deposition and its Application to GaN-Based Bipolar Transistors"; Journal of Allpied Physics 97, 2005, 4 pgs.
Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.
Yoon et al., "Vertical Cross-Point Resistance Change Memory for Ultra-High Density Non-volatile Memory Applications", 2009 Symposium on VLSI Technology Digest of Technical Papers, pp. 26-27.
Yu et al., "Structure Effects on Resistive Switching of Al/TiOx/Al Devices for RRAM Applications", IEEE, 2008, pp. 331-333.

* cited by examiner

NONVOLATILE MEMORY CELLS AND ARRAYS OF NONVOLATILE MEMORY CELLS

CROSS REFERENCE TO RELATED APPLICATION

This patent resulted from a divisional application of U.S. patent application Ser. No. 13/010,048 filed Jan. 20, 2011, entitled "Nonvolatile Memory Cells and Arrays of Nonvolatile Memory Cells", naming Zengtao T. Liu and David H. Wells as inventors, the disclosure of which is incorporated by reference.

TECHNICAL FIELD

Embodiments disclosed herein pertain to nonvolatile memory cells, to arrays of nonvolatile memory cells, and to methods of forming arrays of nonvolatile memory cells.

BACKGROUND

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material received there-between. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

Some programmable materials may contain mobile charge carriers larger than electrons and holes, for example ions in some example applications. Regardless, the programmable materials may be converted from one memory state to another by moving the mobile charge carriers therein to alter a distribution of charge density within the programmable materials. Some example memory devices that utilize ions as mobile charge carriers are resistive RAM (RRAM) cells, which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between first a memory state in which charge density is relatively uniformly dispersed throughout the material and a second memory state in which the charge density is concentrated in a specific region of the material (for instance, a region closer to one electrode than the other).

A PMC may similarly have programmable material sandwiched between a pair of current conductive electrodes. The PMC programmable material comprises ion conductive material, for example a suitable chalcogenide or any of various suitable oxides. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across the electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

DETAILED DESCRIPTION OF EXAMPLE EMBODIMENTS

Figures 1, 2, 3:
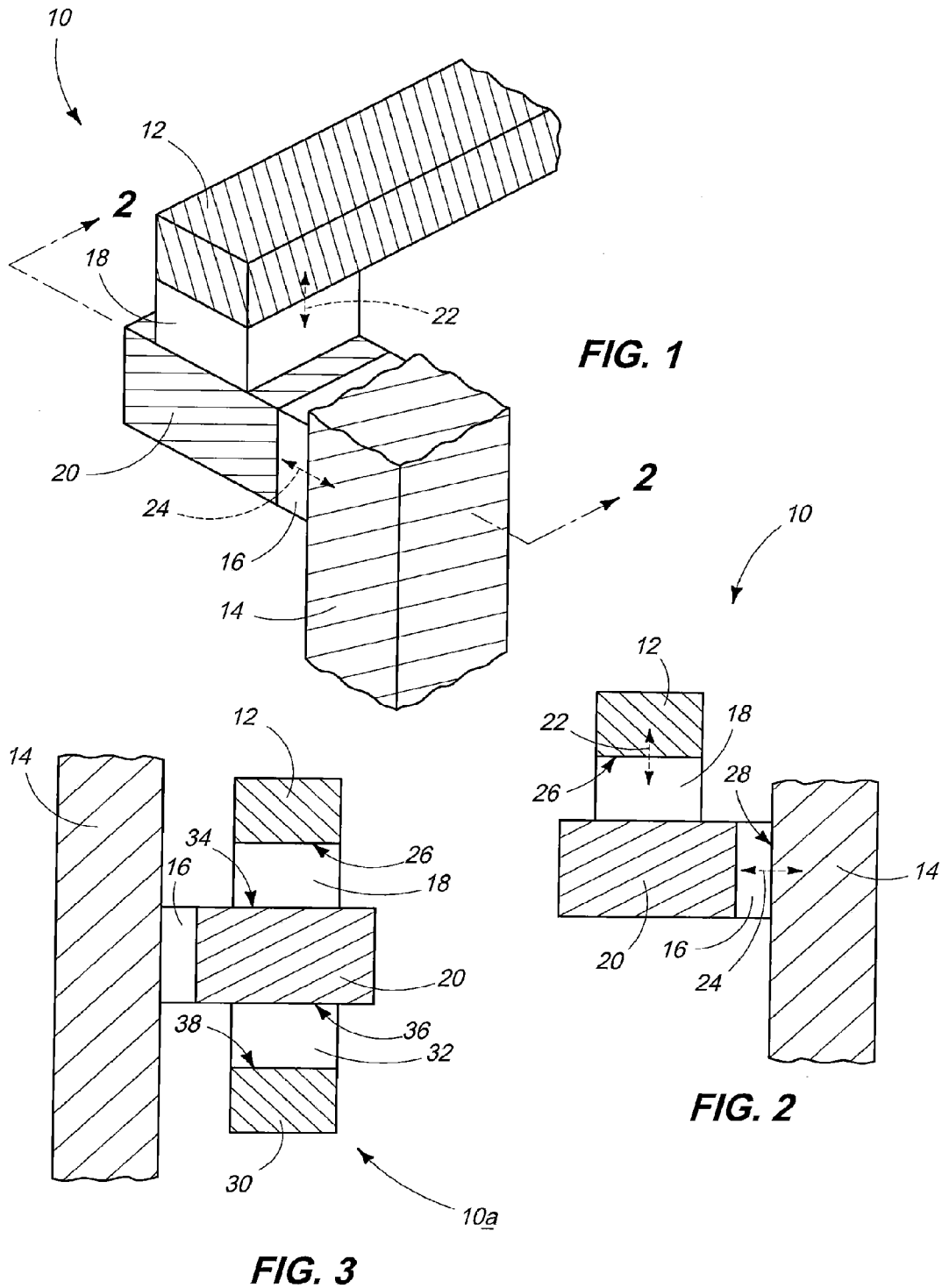
FIG. 1 is a diagrammatic isometric view of a nonvolatile memory cell in accordance with an embodiment of the invention.
FIG. 2 is a sectional view of FIG. 1 taken through line 2-2 in FIG. 1.
FIG. 3 is a diagrammatic sectional view of a nonvolatile memory cell in accordance with an embodiment of the invention.

Example embodiments of a nonvolatile memory cell are initially described with reference to FIGS. 1 and 2 with respect to a memory cell 10 which has a first electrode 12 and a second electrode 14. Reference to "first" and "second" with respect to electrodes 12 and 14 is for convenience in description, and either may be considered as a "first" or a "second" electrode in a memory cell which comprises two electrodes. Electrodes 12 and 14 may be in the form of continuous lines respectively shared by multiple memory cells, or one or both may be configured as a respective isolated construction of a single memory cell. Electrodes 12 and 14 comprise current conductive material, and may be homogenous or non-homogenous. In the context of this document, "current conductive material" is a composition where electric current flow would inherently occur therein predominantly by movement of subatomic positive and/or negative charges when such are generated as opposed to predominantly by movement of ions. Example current conductive materials are elemental metals, alloys of elemental metals, current conductive metal compounds, and conductively doped semiconductive material, including any combinations thereof.

Programmable material 16 and a select device 18 are received in electrical series connection between and with first electrode 12 and second electrode 14. (In other words, material 16 and device 18 are both between electrodes 12 and 14 in electrical series connection with electrodes 12 and 14.) Current conductive material 20 is received in electrical series connection between and with programmable material 16 and select device 18. (In other words, material 20 is both between material 16 and device 18 and in electrical series connection with material 16 and device 18.) Current conductive material 20 may or may not form a part of the select device. Regardless, the depicted positions of programmable material 16 and select device 18 may be reversed. Any existing or yet-to-be-developed select device may be used, with transistors and diodes being but two examples. Regardless, each of components 16 and 18 may be homogenous or non-homogenous, and may be of the same or different shape, thickness, other dimensions, etc. Current conductive material 20 also may be homogenous or non-homogenous. Example materials include any of those described above with respect to first electrode 12 and second electrode 14. Any two or three of conductive material of components 12, 14 and 20 may be of the same composition or of different compositions. Memory cell 10 would likely be surrounded by dielectric material which is not shown for clarity in the figures with respect to the example operative components of memory cell 10 just-described.

Programmable material 16 may be solid, gel, amorphous, crystalline, or any other suitable phase. Any existing or yet-to-be developed programmable material may be used, with only some examples being provided below.

One example programmable material is ion conductive material. Example suitable such materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and $CuTe$) and/or oxides such as zirconium oxide, hafnium oxide, tungsten oxide, copper oxide, niobium oxide, iron oxide, silicon oxide (specifically, silicon dioxide), gadolinium oxide, etc. capable of inherently (or with additive) supporting electrolyte behavior. Such may have silver, copper, cobalt, and/or nickel ions, and/or other suitable ions, diffused therein for ionic conduction, analogously to structures disclosed in U.S. Pat. No. 7,405,967 and U.S. Patent Publication Number 2010/0193758.

Additional example programmable materials include multi-resistive state metal oxide-comprising material. Such may comprise, for example, at least two different layers or regions generally regarded as or understood to be active or passive regions, although not necessarily. Alternately, such may only comprise active material. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $SrZrO_3$, $BaTiO_3$, $Ba_{(1-x)}Sr_x$-$TiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, a programmable material composite might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed.

The programmable material may comprise memristive material. As an example, such material may be statically programmable semiconductive material which comprises mobile dopants that are received within a dielectric such that the material is statically programmable between at least two different resistance states. At least one of the states includes localization or gathering of the mobile dopants such that a dielectric region is formed and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$. Example programmable materials that comprise oxygen vacancies as mobile dopants may comprise a combination of $TiO_2$ and $TiO_{2-x}$ in at least one programmed resistance state depending on location of the oxygen vacancies and the quantity of the oxygen vacancies in the locations where such are received. An example programmable material that comprises nitrogen vacancies as mobile dopants is a combination of AlN and $AlN_{1-x}$ in at least one programmed state depending on location of the nitrogen vacancies and the quantity of the nitrogen vacancies in the locations where such are received. An example programmable material that comprises fluorine vacancies as mobile dopants may is a combination of $MgF_2$ and $MgF_{2-x}$ in at least one programmed resistance state depending on location of the fluorine vacancies and the quantity of the fluorine vacancies in the locations where such are received. As another example, the mobile dopants may comprise aluminum atom interstitials in a nitrogen-containing material.

Still other example programmable materials include polymer materials such as Bengala Rose, AlQ$_3$Ag, Cu-TCNQ, DDQ, TAPA, and fluorescine-based polymers.

FIGS. 1 and 2 depict an example embodiment wherein immediately adjacent of components 12, 18, 20, 16, and 14 are directly against one another. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another. Other structures than those depicted in FIGS. 1 and 2 are contemplated with respect to whether materials or structures are directly against one another. For example, material in a memory cell may be provided between any pair of components 12 and 18, components 18 and 20, components 20 and 16, and components 16 and 14.

Further and regardless, alternate orientations and constructions to that shown by FIGS. 1 and 2 may be employed. FIGS. 1 and 2 do disclose one ideal embodiment wherein first electrode 12, second electrode 14, programmable material 16 or 18, and select device 16 or 18 are oriented relative one another for predominant current flow relative first electrode 12 and programmable material or select device 18 in a first direction 22. Such components are oriented for predominant current flow relative to second electrode 14 and the other of select device or programmable material 16 in a second direction 24 which is orthogonal to first direction 22. FIGS. 1 and 2 also depict an example embodiment wherein electrodes 12 and 14 have respective first and second planar surfaces 26 or 28 directly against which component/material 18 and 16, respectively, is received. Further in such example, such planar surfaces constitute all surface area against which material/components 18 and 16 are received against their respective electrode. Alternately as an example, interface between the electrodes and material/components 16 and/or 18 may be with respect to entirely non-planar surfaces, a combination of planar and non-planar surfaces, or a combination of multiple stepped planar surfaces.

In one embodiment, a nonvolatile memory cell has a select device which comprises a first diode configured to conduct current from the second electrode to the first electrode via the programmable material and the current conductive material. Such a memory cell further comprises a third electrode and a second diode, with the second diode being configured to conduct current from the third electrode to the second electrode via the current conductive material and the programmable material. In one embodiment, the first diode may be configured to conduct current from the second electrode through the programmable material, then through the current conductive material, and then through the first diode to the first electrode. In one embodiment, the second diode may be configured to conduct current from the third electrode through the second diode, then through the current conductive material, and then through the programmable material to the second electrode. One such example embodiment memory cell 10a is shown in FIG. 3. Like numerals from the first-described embodiments have been used where appropriate, with some construction differences being indicated with the suffix "a" or with different numerals.

For example, memory cell 10a in one embodiment comprises programmable material 16, with select device 18 comprising a first diode configured for current flow into first electrode 12 from current conductive material 20 as opposed to operative conductive current flow in the opposite direction.

A third electrode 30 is provided in series electrical connection with current conductive material 20 through a second diode 32 sandwiched there-between. Second diode 32 is configured to conduct current from third electrode 30 to second electrode 14 via programmable material 16 and current conductive material 20 as opposed to the opposite direction. Alternately by way of example only, the above-described bias current flow directions for a diode 18 and a diode 32 may be reversed.

In one embodiment, first diode 18 is directly against an elevationally outermost surface 34 of current conductive material 20, and in one embodiment is directly against an elevationally innermost surface 26 of first electrode 12. In one embodiment, second diode 32 is directly against an elevationally innermost surface 36 of current conductive material 20, and in one embodiment is directly against an elevationally outermost surface 38 of third electrode 30.

Figure 4:
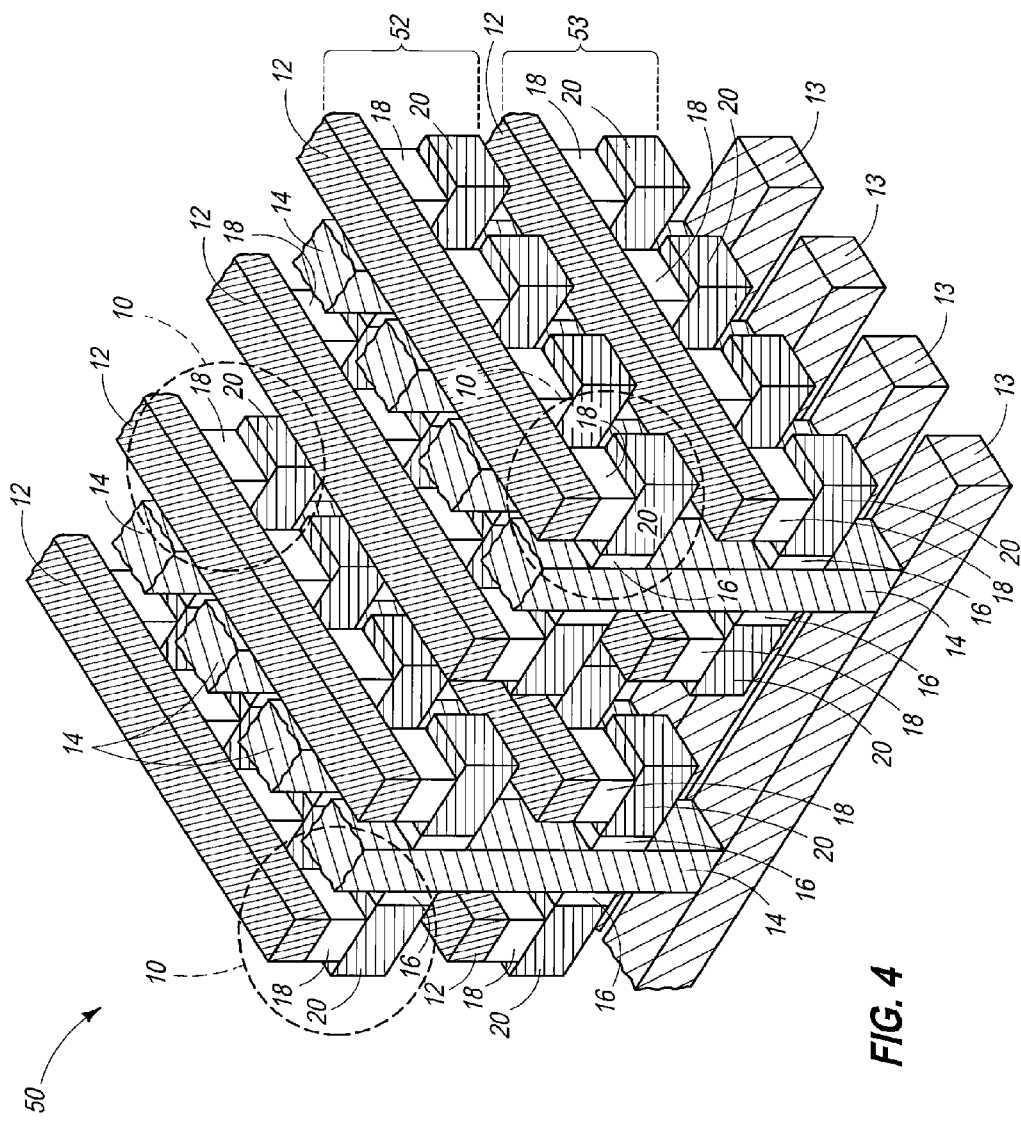
FIG. 4 is a diagrammatic isometric view of an array of vertically stacked tiers of nonvolatile memory cells in accordance with an embodiment of the invention.

Embodiments of the invention encompass an array of vertically stacked tiers of nonvolatile memory cells, for example an array 50 as shown in FIG. 4. Array 50 would be fabricated relative to a suitable base substrate (not shown) which may be homogenous or non-homogenous, for example, comprising multiple different composition materials and/or layers. As an example, such may comprise bulk monocrystalline silicon and/or a semiconductor-on-insulator substrate. As an additional example, such may comprise dielectric material having conductive contacts or vias formed therein which extend vertically or otherwise into current conductive electrical connection with electronic device components, regions, or material received elevationally inward of the dielectric material. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further in this document, "elevational" and "elevationally" are with reference to the vertical direction from a base substrate (not shown) upon which the circuitry is fabricated. The base substrate may or may not be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Array 50 incorporates a plurality of the memory cell 10 of FIGS. 1 and 2. Accordingly, like numerals from FIGS. 1 and 2 have been used in FIG. 4 where appropriate, with some construction differences being indicated with different numerals. Referring to FIGS. 1, 2 and 4, array 50 comprises a plurality of horizontally oriented first electrode lines 12 within individual tiers 52 and 53 of memory cells 10. A plurality of horizontally oriented global second electrode lines 13 have local vertical second electrode line extensions 14 extending through multiple of the tiers of memory cells 10, for example through each of tiers 52 and 53 as shown. Global second electrode lines 13 may alternately, by way of example only, be formed elevationally/vertically outward of tier 52. Such may comprise current conductive material.

Individual memory cells 10 of array 50 may have any of the constructions, materials, attributes, etc. as described above in connection with FIGS. 1 and 2. Individual memory cells 10 comprise a crossing one of horizontal first electrode lines 12 and one of local vertical second electrode line extensions 14 having material/components 18, 20, 16 there-between. Accordingly, an individual memory cell 10 of array 50 comprises programmable material 16 or 18, a select device of the other of structures 16 and 18 in electrical series connection through current conductive material 20. The programmable material and the select device are in electrical series connection with the crossing ones of horizontal first electrode lines 12 and local vertical second electrode line extensions 14. Immediately adjacent components of the individual memory cells may be directly against one another or have other material(s)/components there-between, as described above.

The programmable material and the select device of individual memory cells 10 within array 50 are oriented for predominant current flow into or out of the crossing one local vertical second electrode line extension out of or into, respectively, one of the programmable material or select device in a horizontal direction 24 (FIG. 1). Such are also oriented for predominant current flow into or out of the crossing one horizontal electrode line out of or into, respectively, the other of the programmable material and select device in a vertical direction 22 (FIG. 1). Further in FIGS. 1, 2, and 4, the depicted programmable material may be isolated relative to each memory cell as shown, or alternately might be continuous along some plurality of memory cells. For example a programmable material 16 may extend continuously (not shown) along the local vertical second electrode extensions 14.

Figure 5:
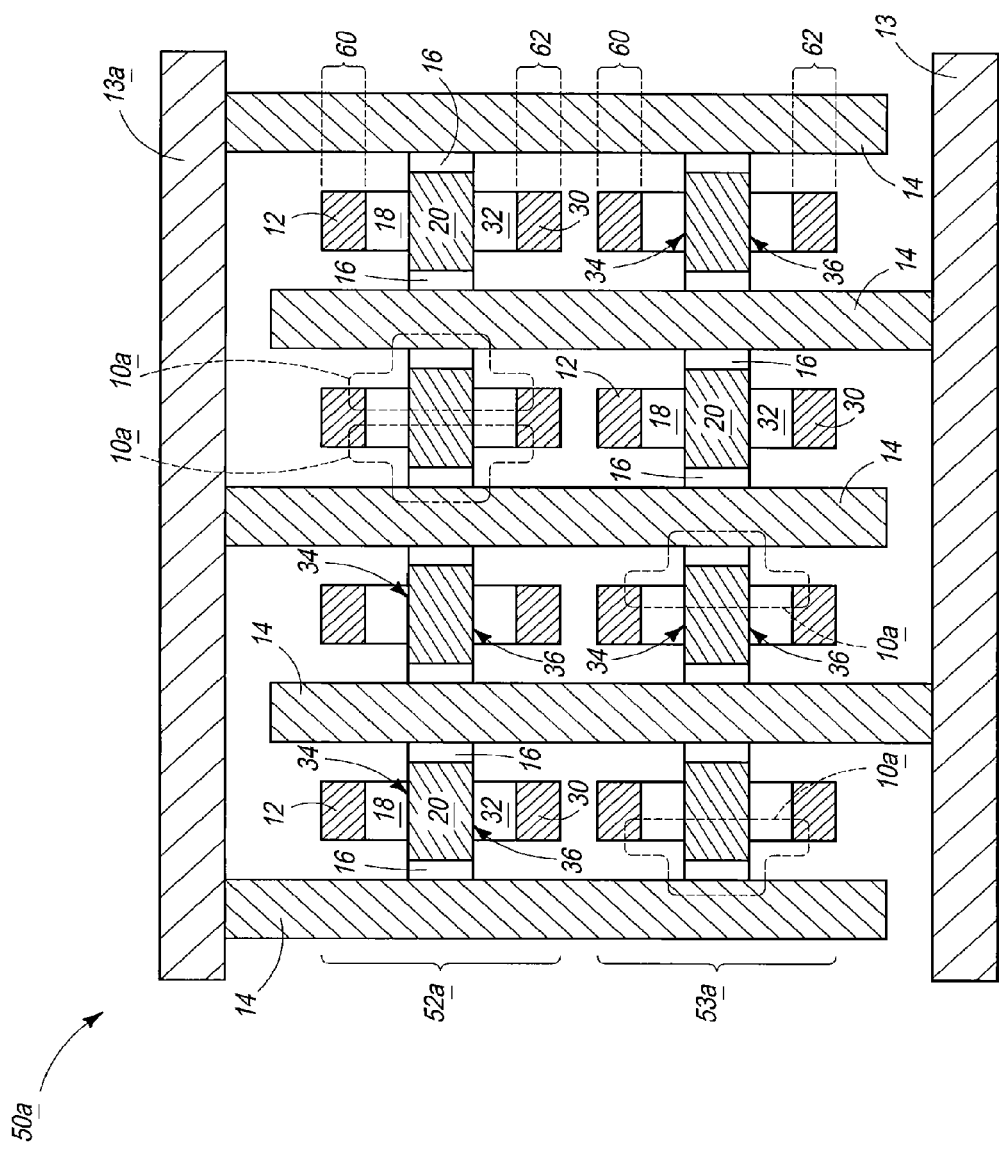
FIG. 5 is a sectional view of an array of vertically stacked tiers of nonvolatile memory cells in accordance with an embodiment of the invention.

An alternate embodiment array 50a of vertically stacked tiers of nonvolatile memory cells is shown in FIG. 5. Like numerals from the above-described embodiments have been used where appropriate, with some construction differences being indicated with the suffix "a" or with different numerals. FIG. 5 depicts an array comprising memory cells 10a of FIG. 3, and is analogous to the schematic circuit and operation as described in U.S. patent application Ser. No. 12/141,388 and which is now U.S. Patent Publication No. 2009-0316467. Individual tiers 52a and 53a respectively comprise an elevationally outer tier 60 and an elevationally inner tier 62 of respective pluralities of horizontally oriented data/sense lines 12 or 30. FIG. 5 is a vertical section view as would be taken through and along the longitudinal centers of local vertical second electrode line extensions 14. Accordingly, electrode lines 12 and 30 would run into and out of the plane of the page upon which FIG. 5 lies. The other components as depicted in FIG. 5 would repeat throughout the array analogous to the FIG. 4 depiction, but for different respective individual memory cell constructions 10a.

In the embodiment of FIG. 5, second electrode lines 14 comprise access lines. Further, the respective select devices 18 of an individual memory cell comprises a first diode which is directly against an elevationally outermost surface 34 of current conductive material 20, and which is in series current conductive connection with a conductive data/sense line 12 of a respective elevationally outer tier 60. Individual memory cells 10a further comprise a second diode 32 directly against an elevationally innermost surface 36 of current conductive material 20 and which is in series current conductive connection with a horizontally oriented data/sense line 30 of a respective elevationally inner tier 62. Any other attribute as described above with respect to the FIG. 3 embodiment may be employed. In FIG. 5, alternating local vertical second electrode line extensions electrically connect with horizontally oriented global second electrode lines 13 or 13a. Also, current conductive material 20 is shared by immediately laterally adjacent memory cells 10a between laterally adjacent second electrode line extensions 14. Further in FIGS. 3 and 5, the depicted programmable material may be isolated relative to each memory cell as shown, or alternately might be continuous along some plurality of memory cells. For example material 16 may extend continuously along the local vertical second electrode extensions 14.

Figure 6:
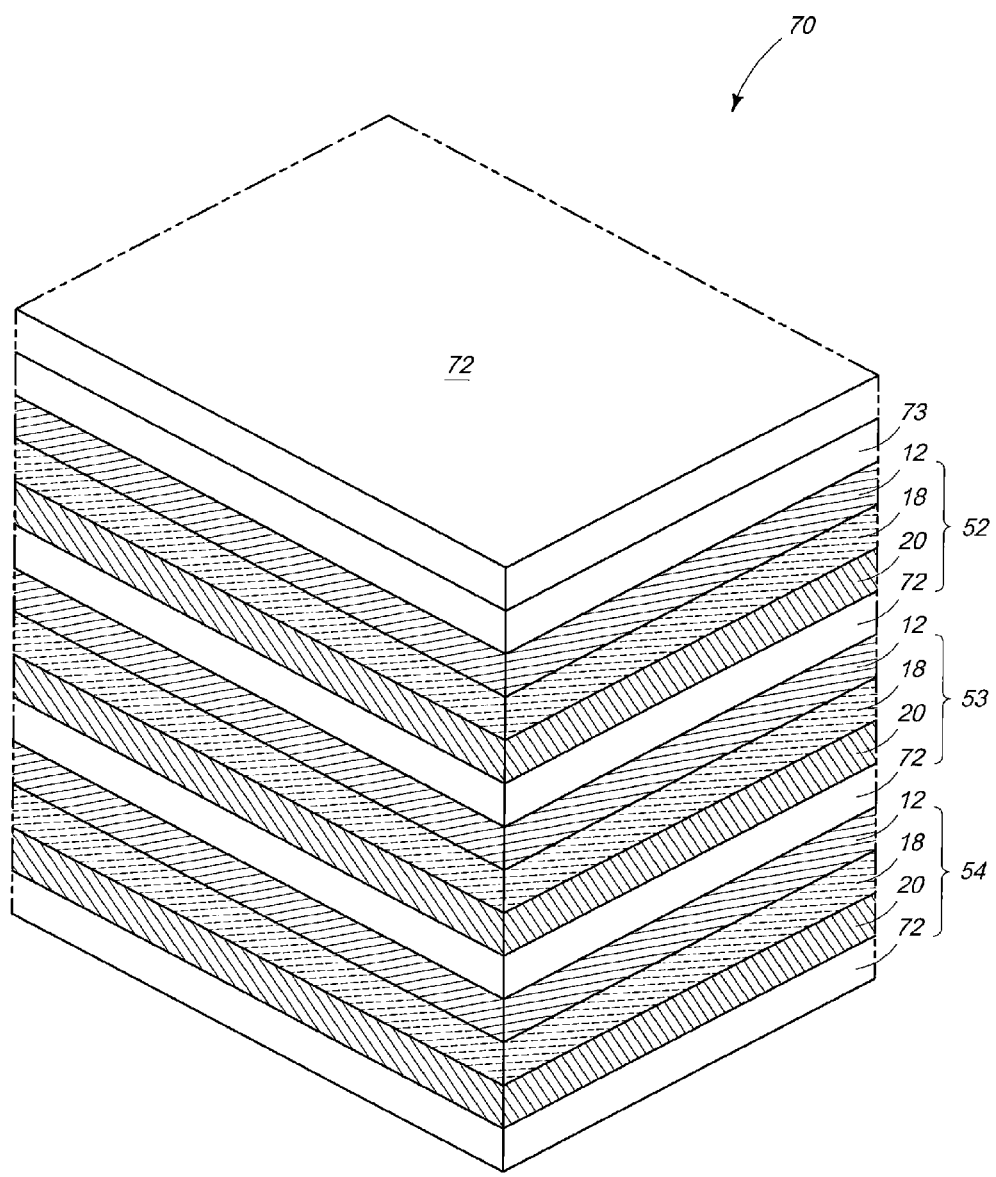
FIGS. 6-31 are diagrammatic isometric views, sectional views, or top views of a substrate fragment in process in ultimately producing an array of vertically stacked tiers of nonvolatile memory cells in accordance with an embodiment of the invention.
Figure 7:
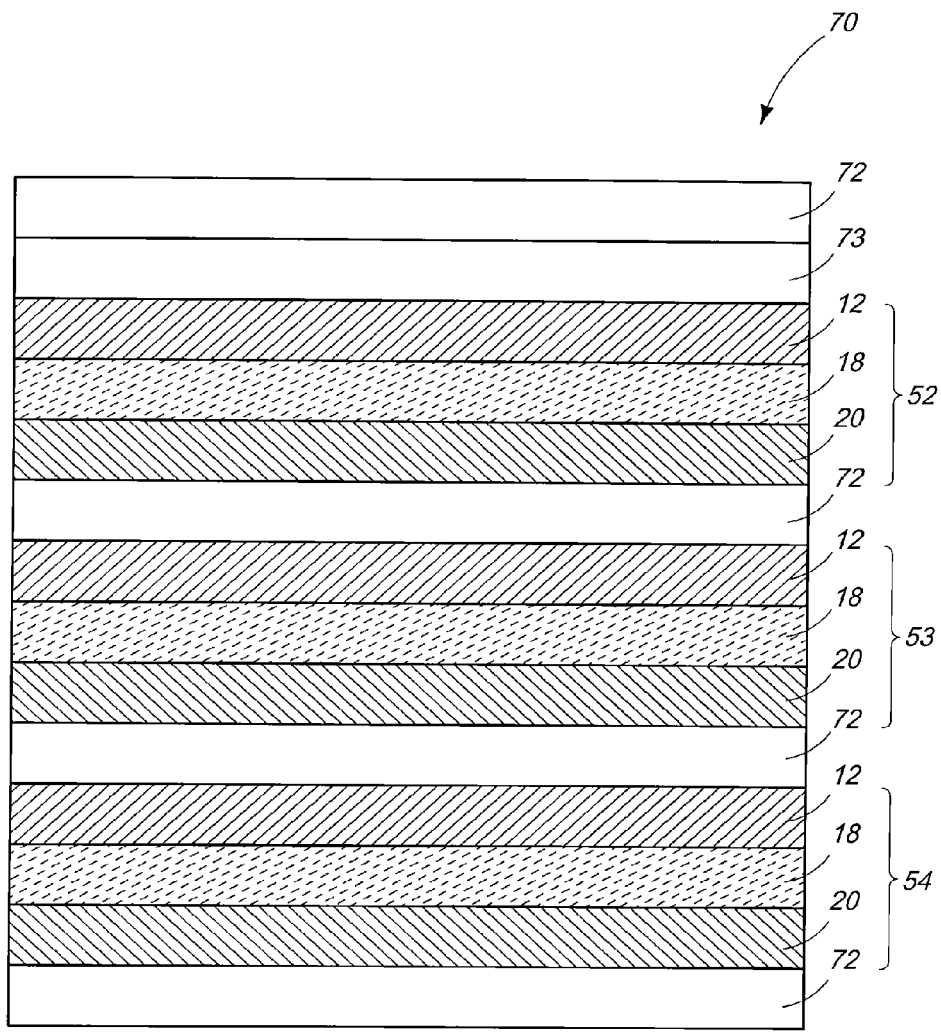

Any of the above constructions may be fabricated in accordance with any existing or yet-to-be-developed technique(s). An example manner of fabricating array 50 of FIG. 4 is next described with reference to FIGS. 6-31. Referring to FIGS. 6 and 7, a substrate fragment in process is indicated generally with reference numeral 70. Like numerals from FIGS. 1, 2, and 4 are used where appropriate, with some construction differences being indicated with the suffix "b" or with different numerals. Further, in FIGS. 6-30, numerals 12, 18, 20, 16 and 14 are used to designate the materials from which such components are fabricated prior to being of the final example shapes for clarity in the drawings and ease of understanding in the description. Blanketing layers of current conductive material 12, programmable or select device material 18, and current conductive material 20 have been provided relative to intervening dielectric material 72. Example such dielectrics include doped or undoped silicon dioxide, and silicon nitride. An example outer dielectric layer is shown as comprising a composite of dielectric material 72 over a different composition dielectric material 73. Accordingly, by way of example only, material 73 might be an other of doped or undoped silicon dioxide or silicon nitride in comparison to the composition of dielectric 72. Each of dielectric materials 72 and 73 may be homogenous or non-homogenous. A suitable base substrate (not shown) as described above would be received inwardly of innermost layer 72. Tiers 52 and 53 of FIG. 4 are designated in FIGS. 6 and 7, as is an additional inner tier 54 within which a plurality of memory cells will be fabricated.

Figure 8:
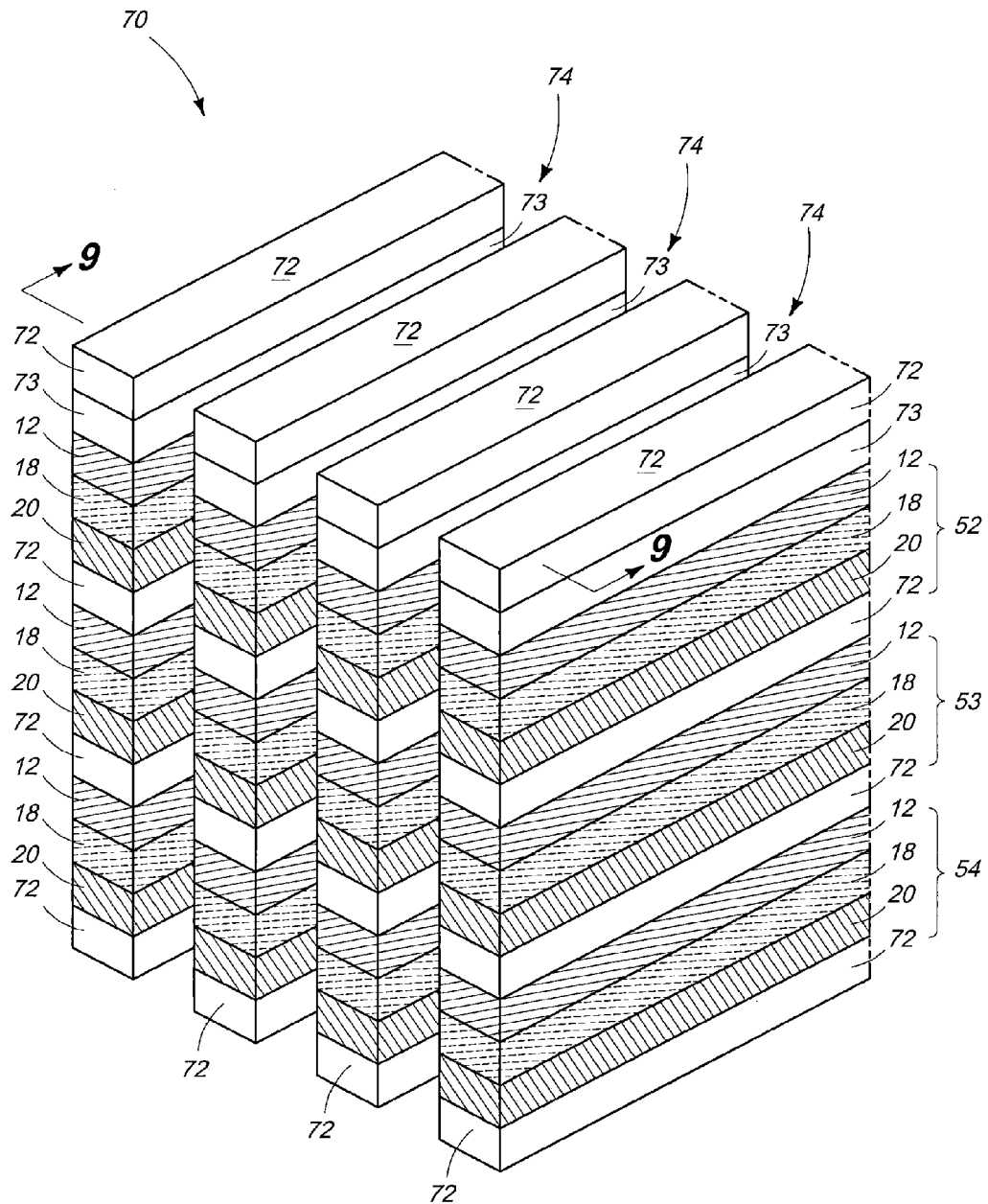
Figure 9:
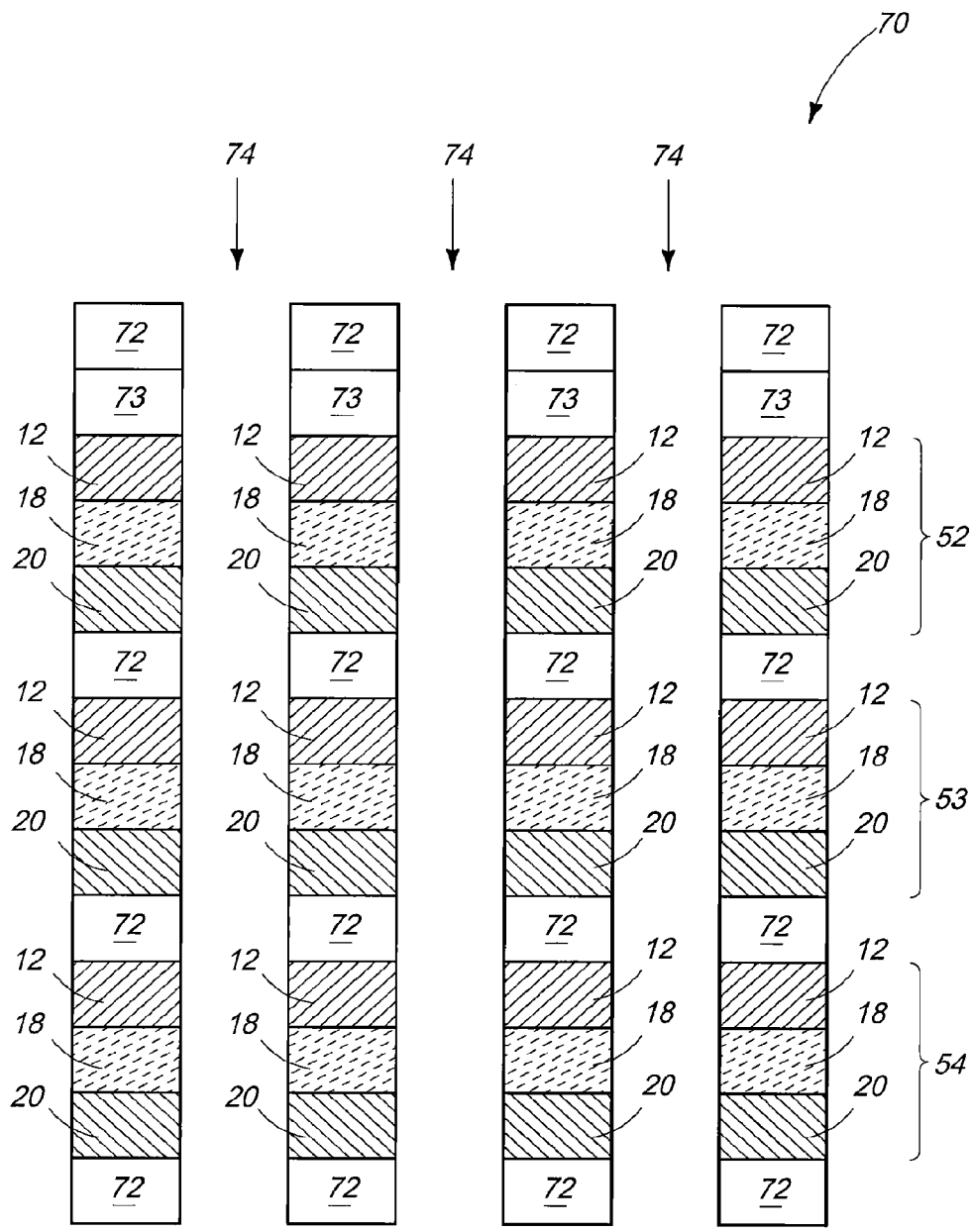

Referring to FIGS. 8 and 9, trenches 74 have been formed through the illustrated materials.

Figure 10:
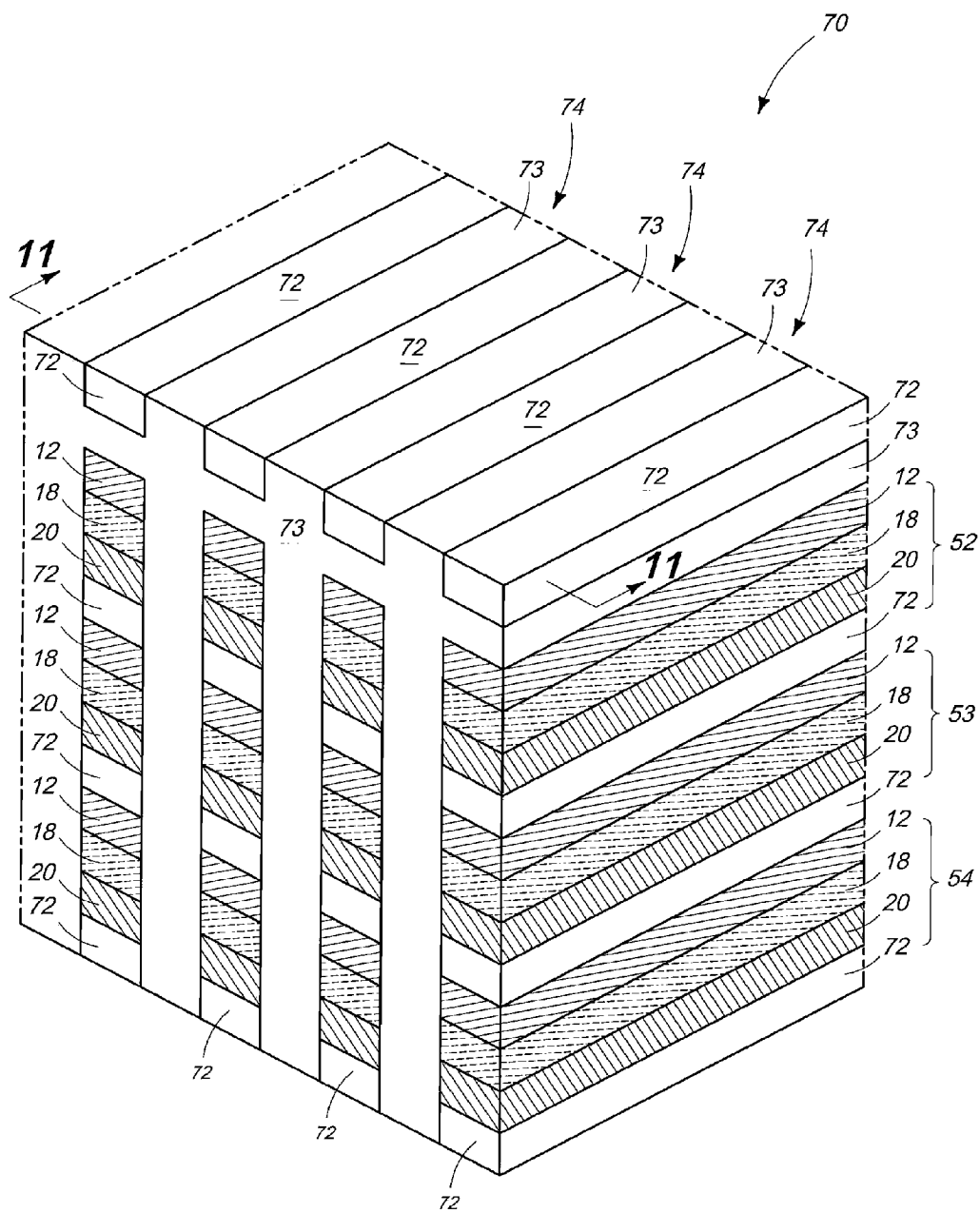
Figure 11:
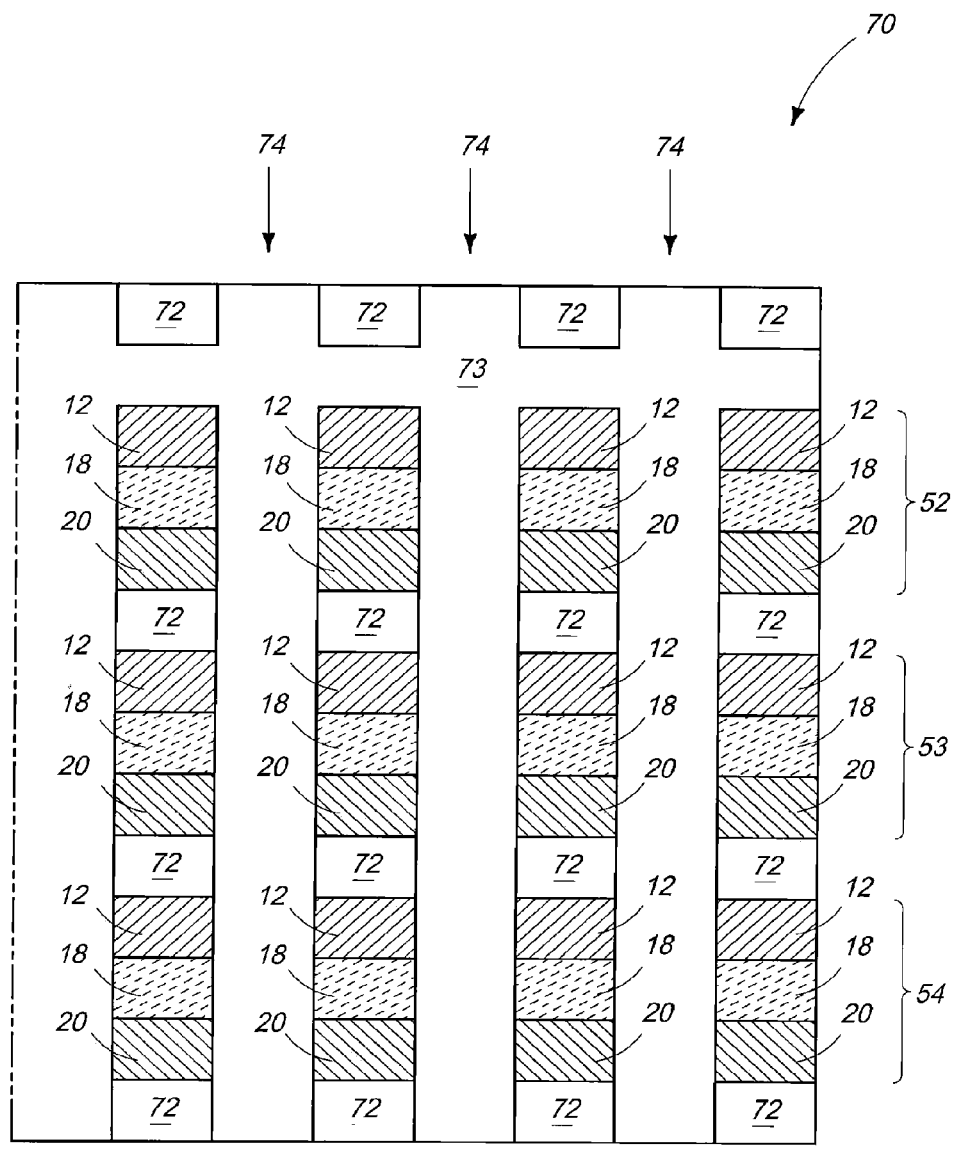

Referring to FIGS. 10 and 11, dielectric material has been formed within trenches 74 and planarized back. In one embodiment, such may be of the same composition as dielectric 73 referred to above and is therefore so designated in the figures.

Figure 12:
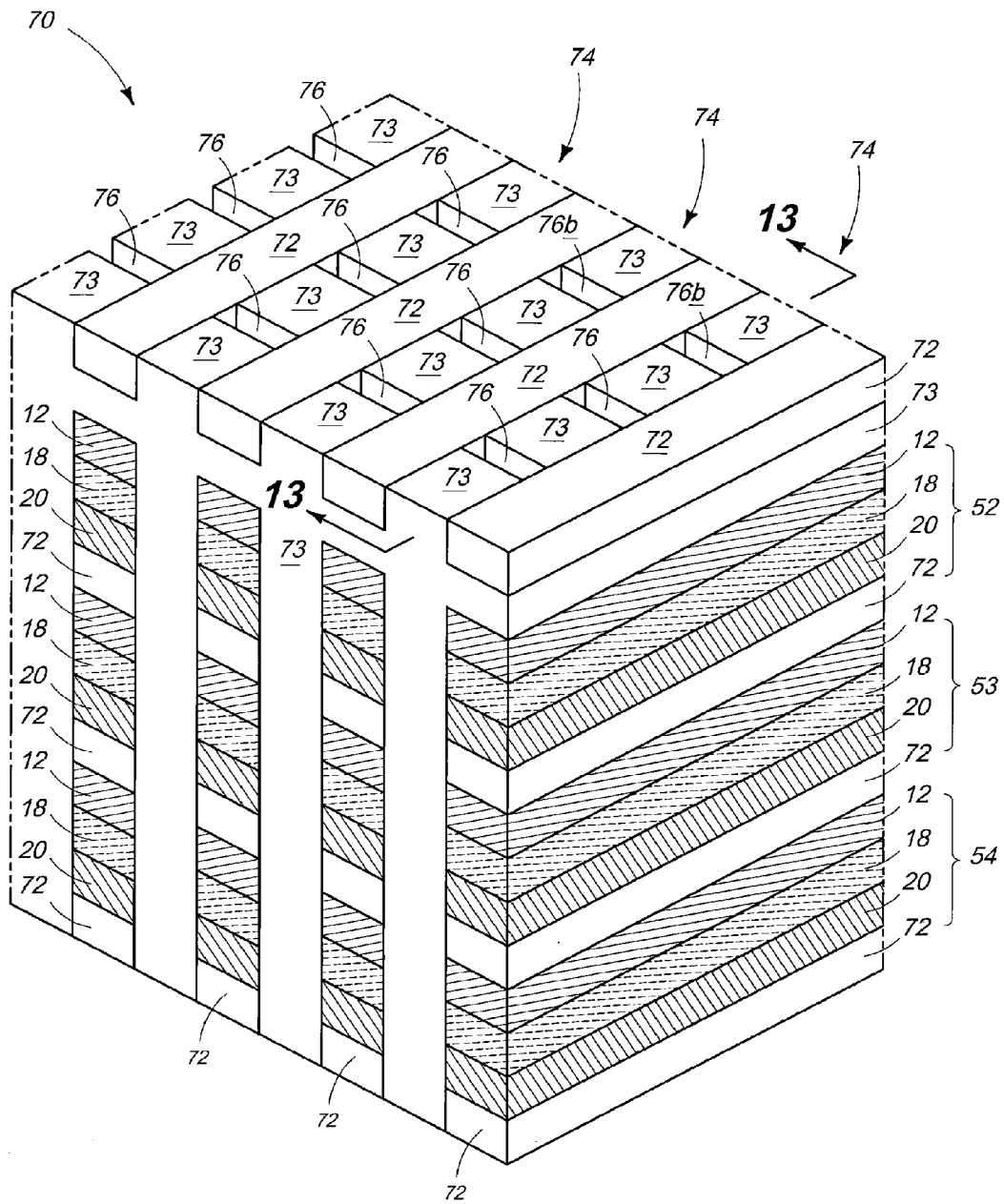
Figure 13:
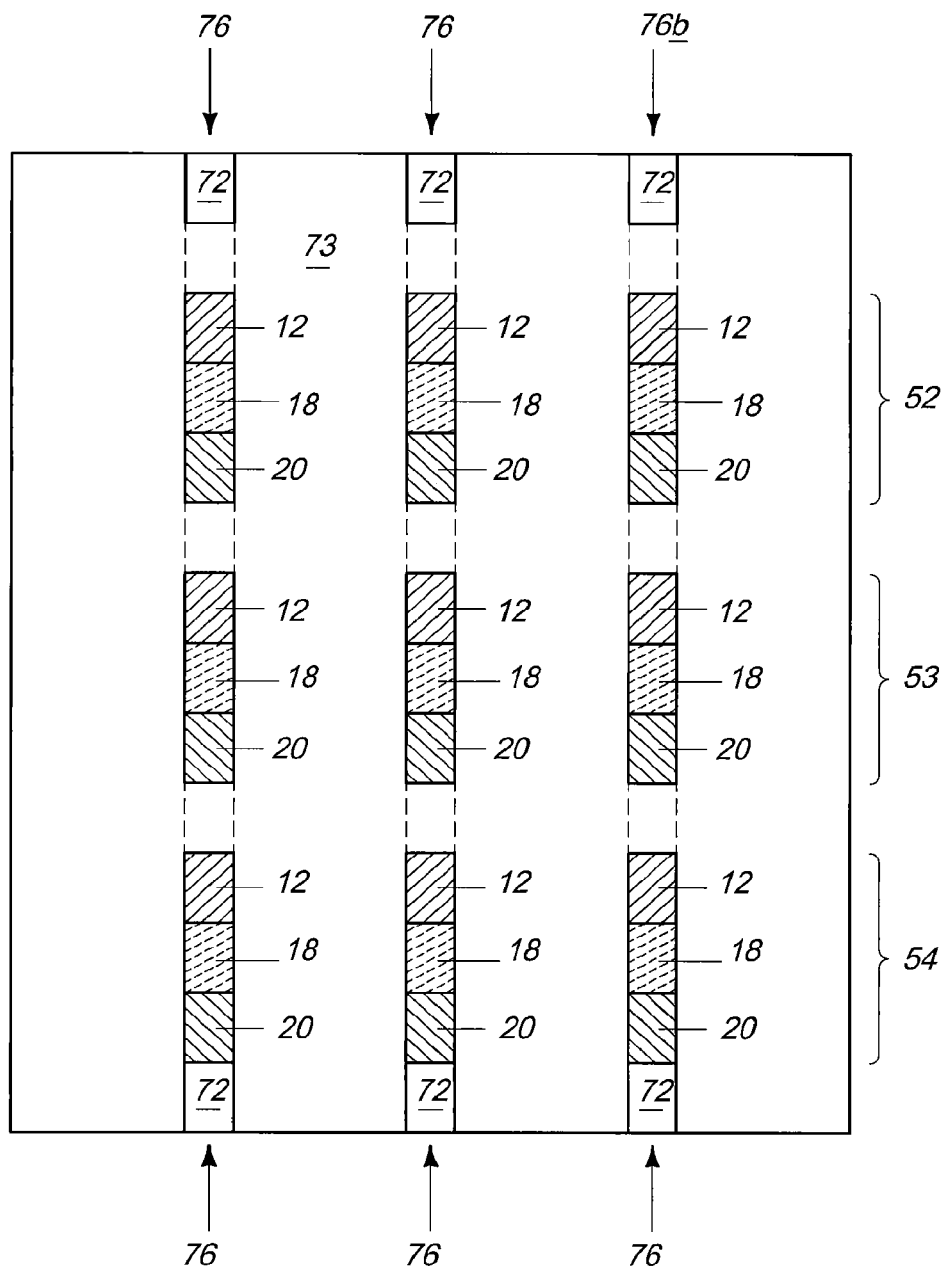

Referring to FIGS. 12 and 13, openings 76 have been formed through the illustrated materials. While FIG. 13 is a section view drawn through line 13-13 in FIG. 12, such is also depicting materials 12, 18 and 20 as would be viewed looking laterally through openings 76 beyond section line 13-13 in FIG. 12.

Figure 14:
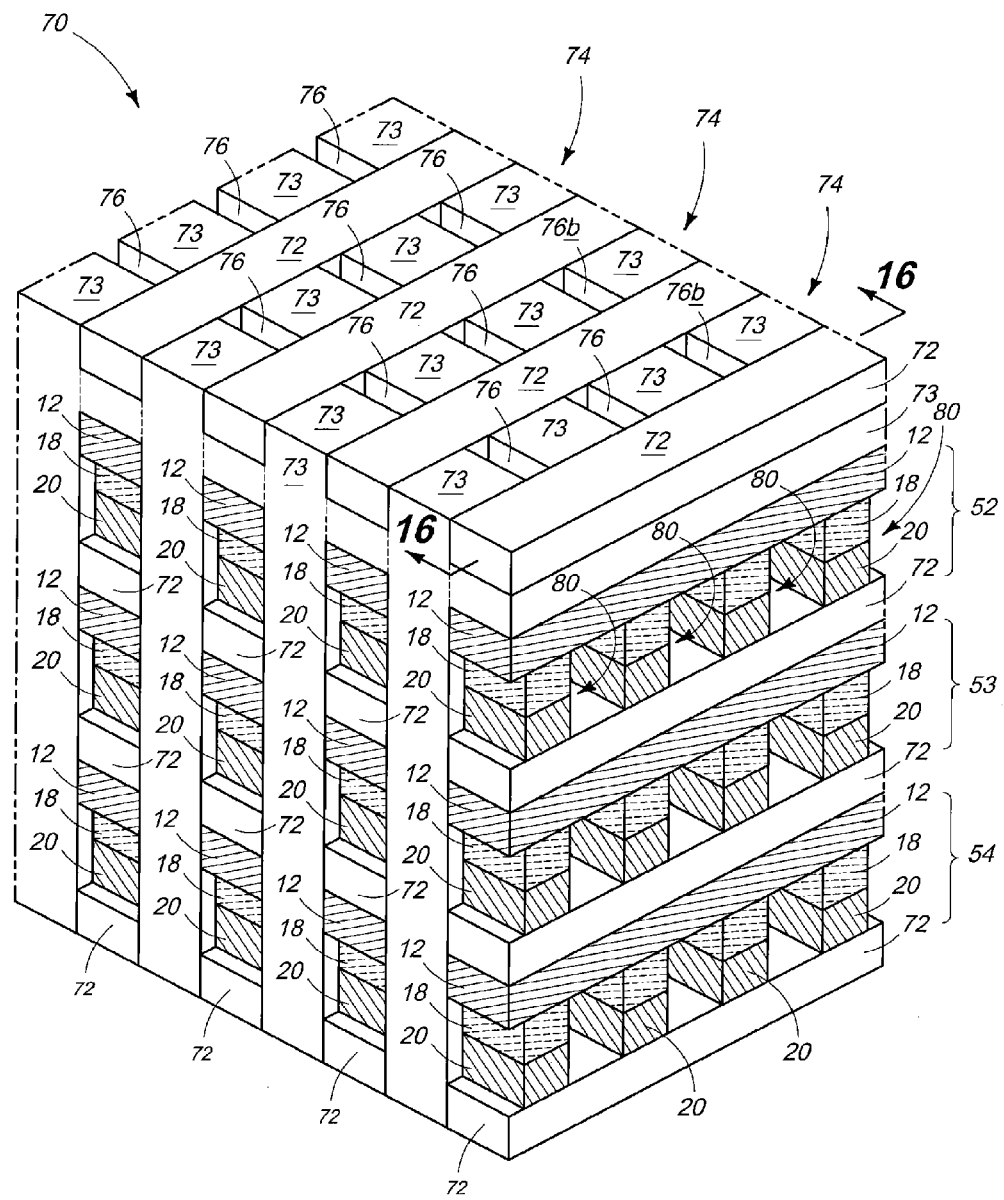
Figure 15:
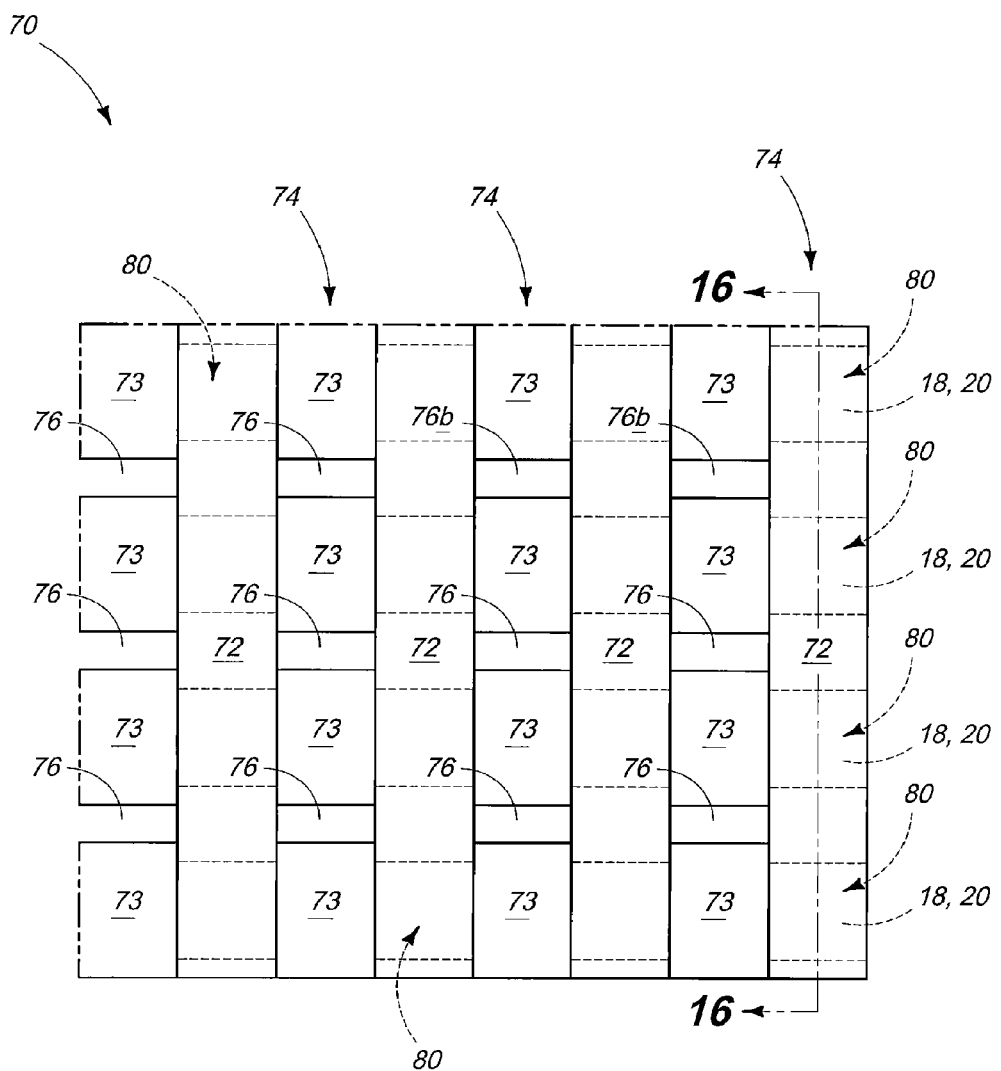
Figure 16:
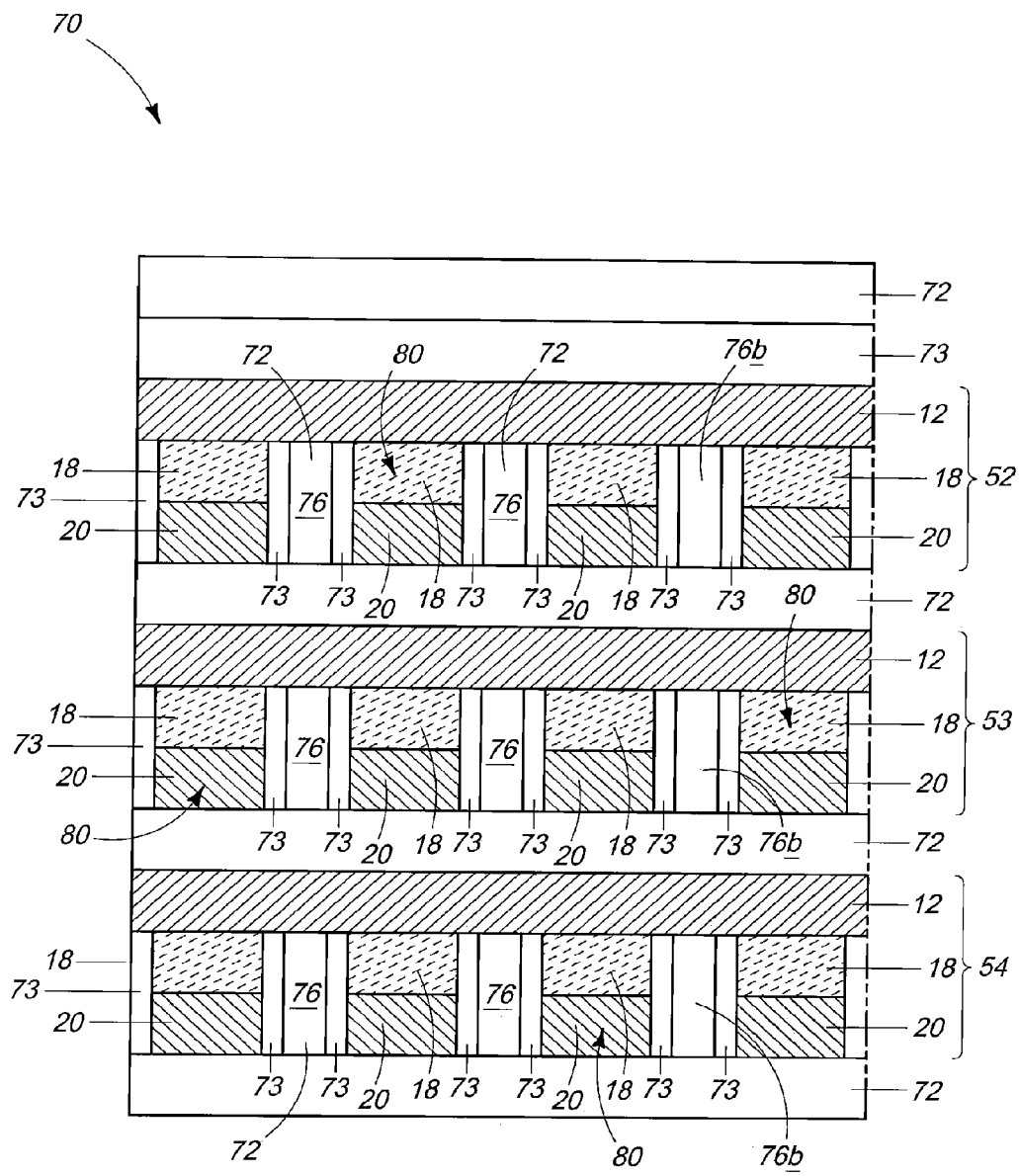

Referring to FIGS. 14-16, a selective isotropic etch has been conducted of materials 18 and 20 relative to materials 72, 73 and 12. Materials 18 and 20 may be so etched in the same etching step, or in separate etching steps. In the context of this document, a selective etch requires removal of one material relative to a stated or shown other material at a ratio of at least 1.5:1.

Figure 17:
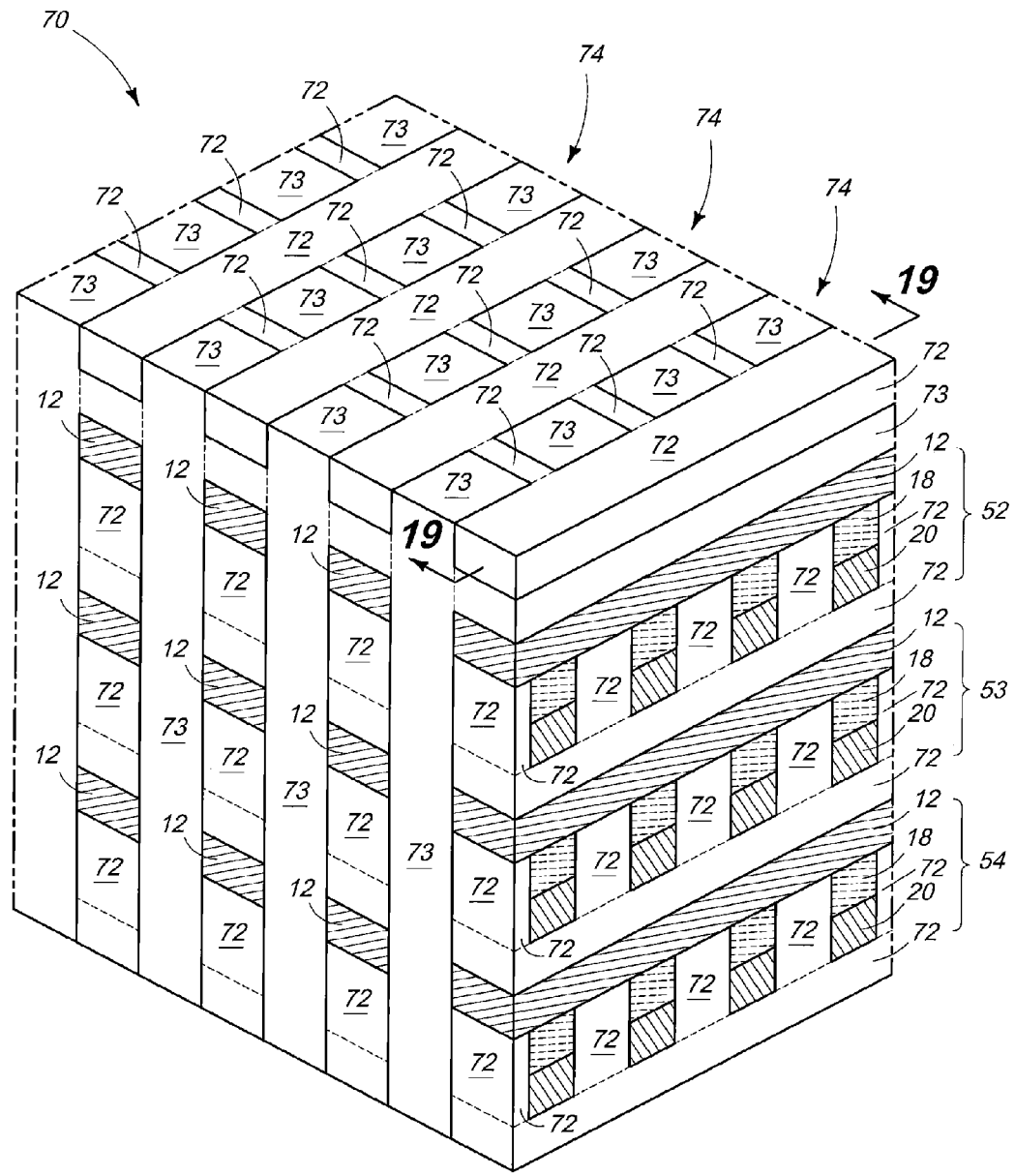
Figure 18:
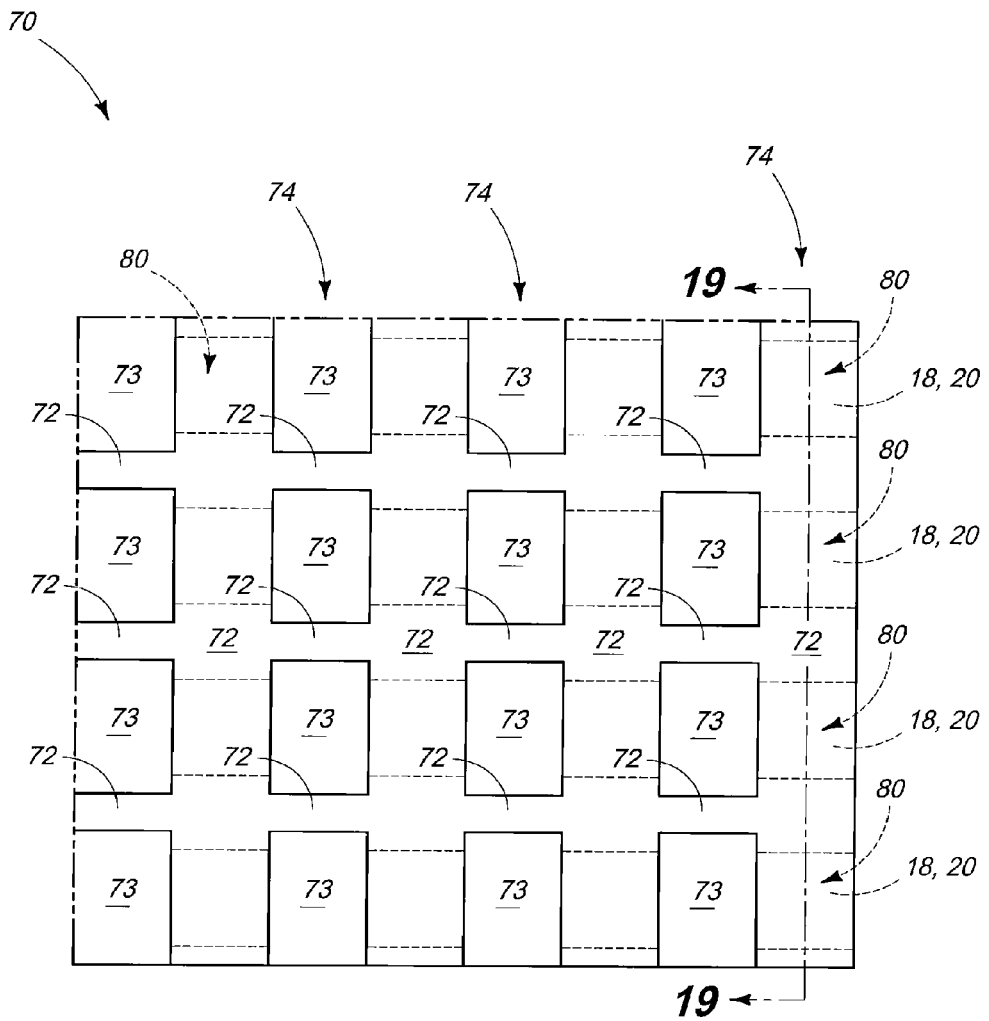
Figure 19:
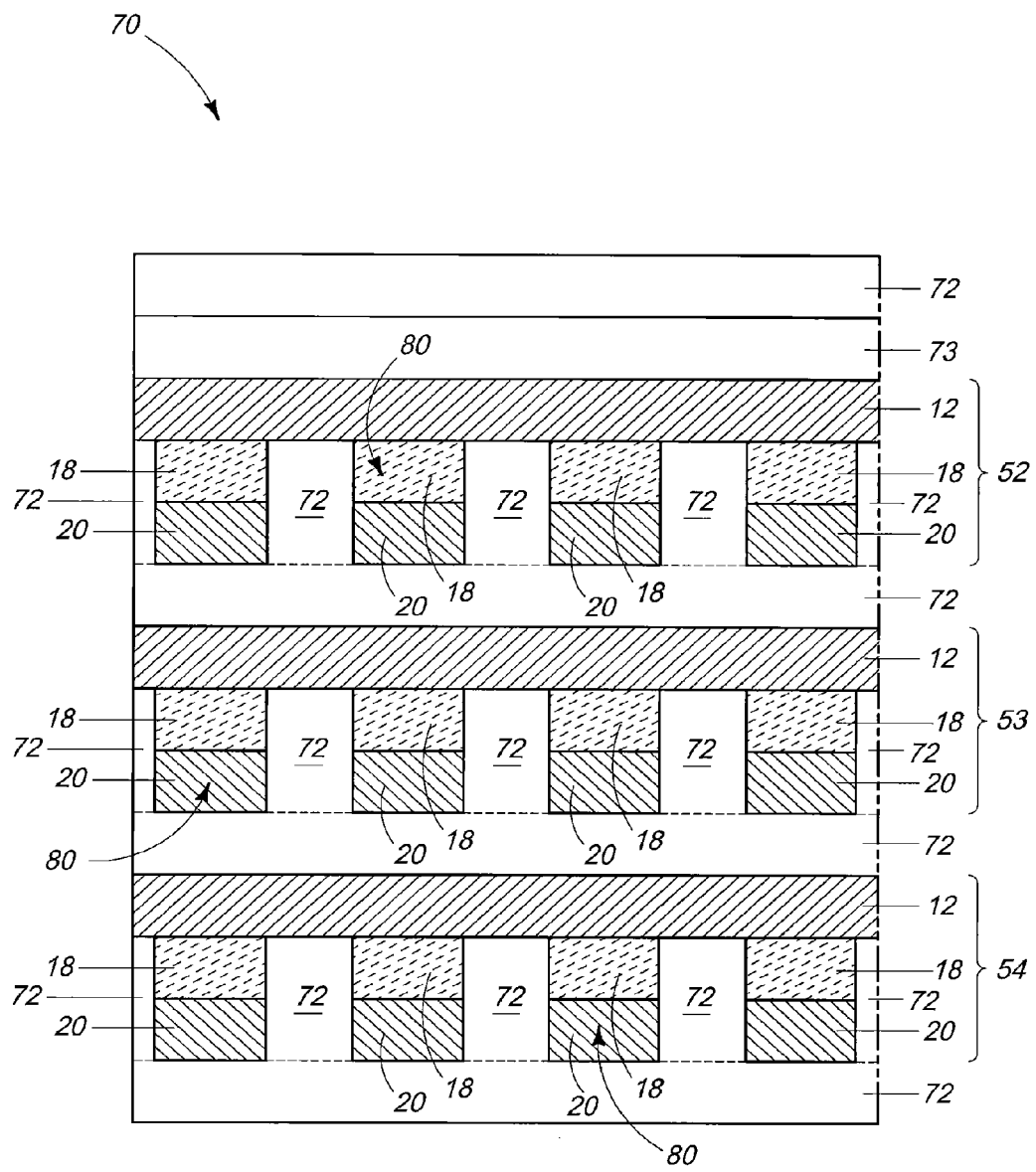

Referring to FIGS. 17-19, dielectric material has been deposited to fill openings 76 and then planarized back. In one embodiment, such may be of the same composition as dielectric 72 referred to above and is therefore so designated in the figures.

Figure 20:
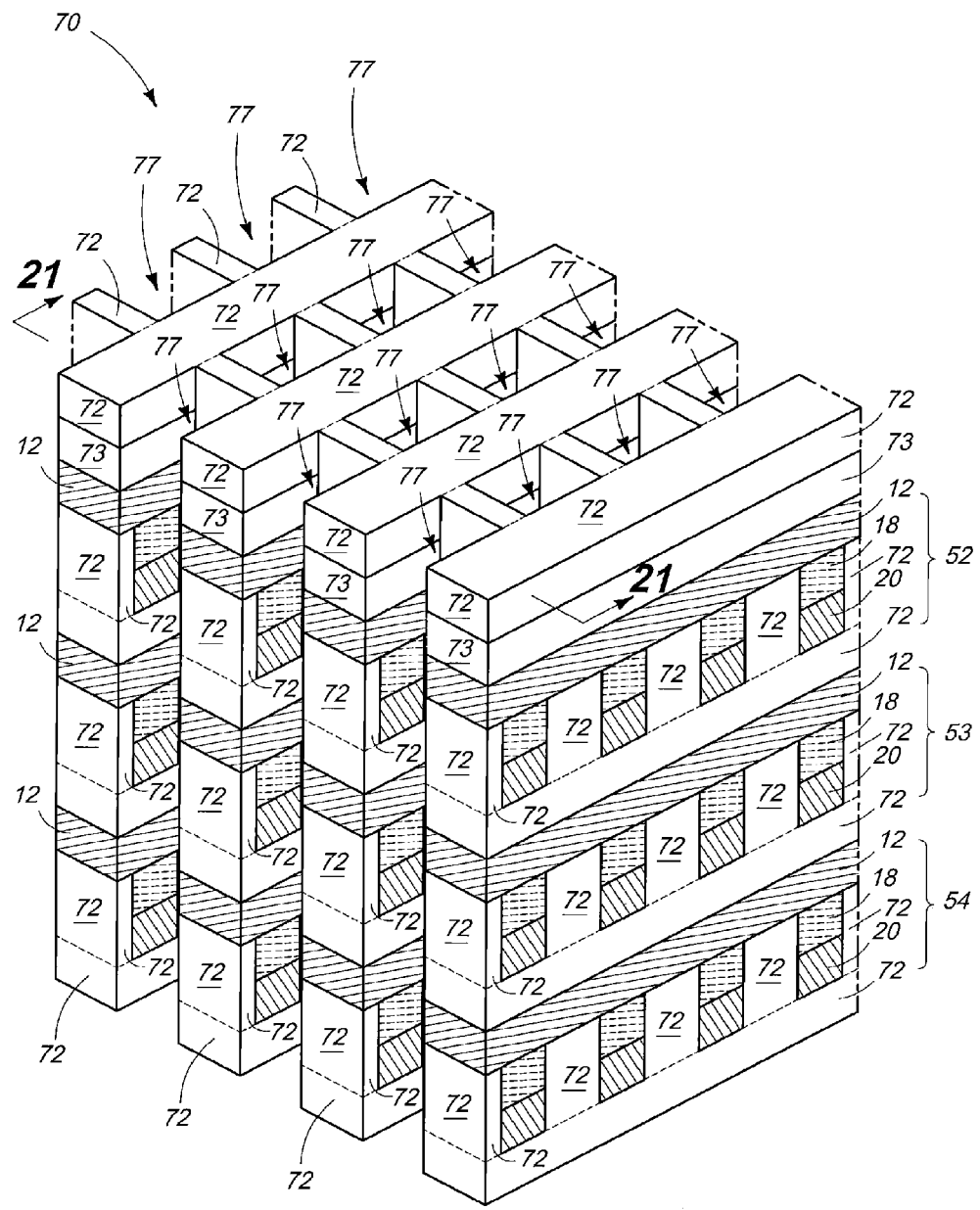
Figure 21:
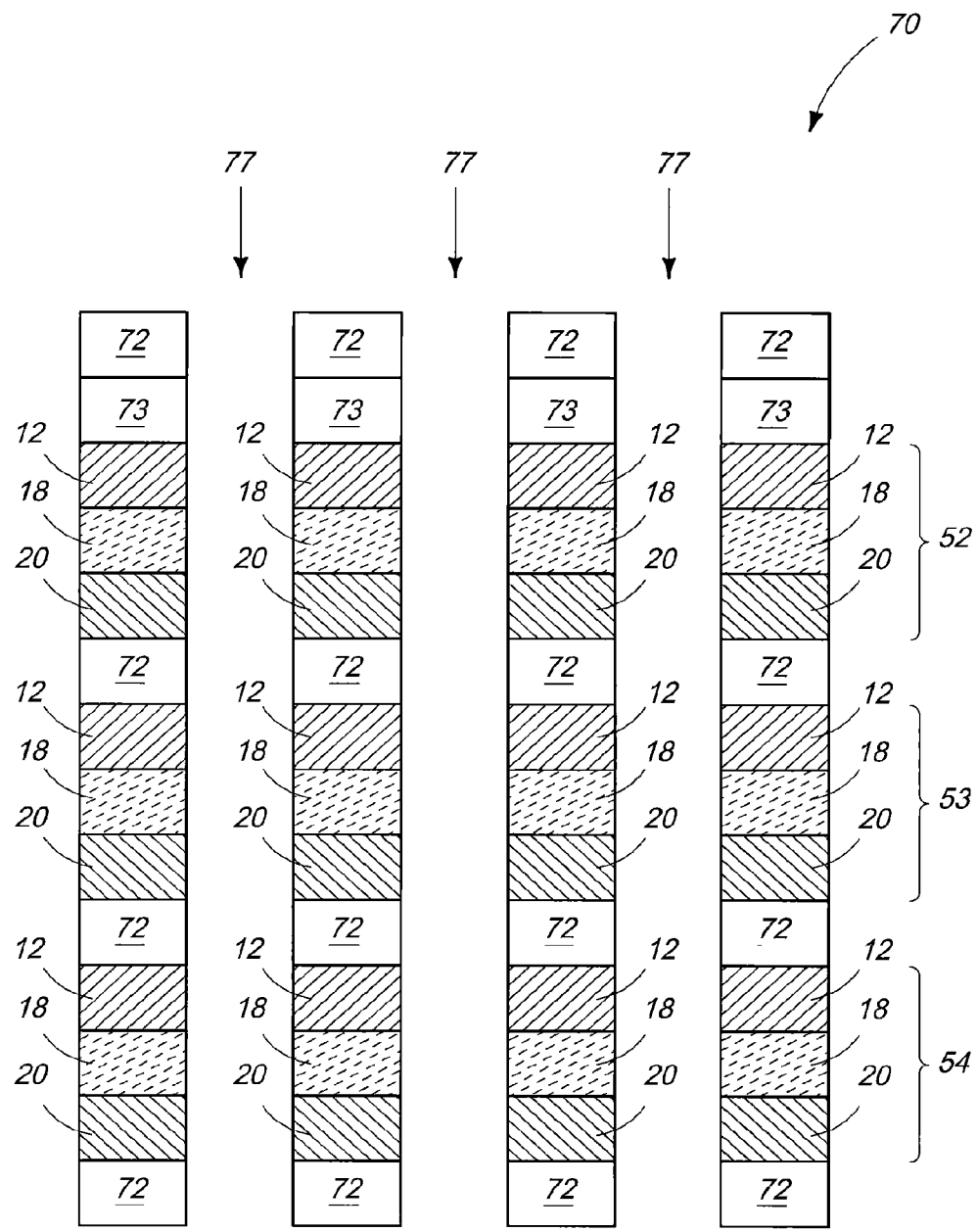

Referring to FIGS. 20 and 21, openings 77 have been formed through the illustrated materials.

Figure 22:
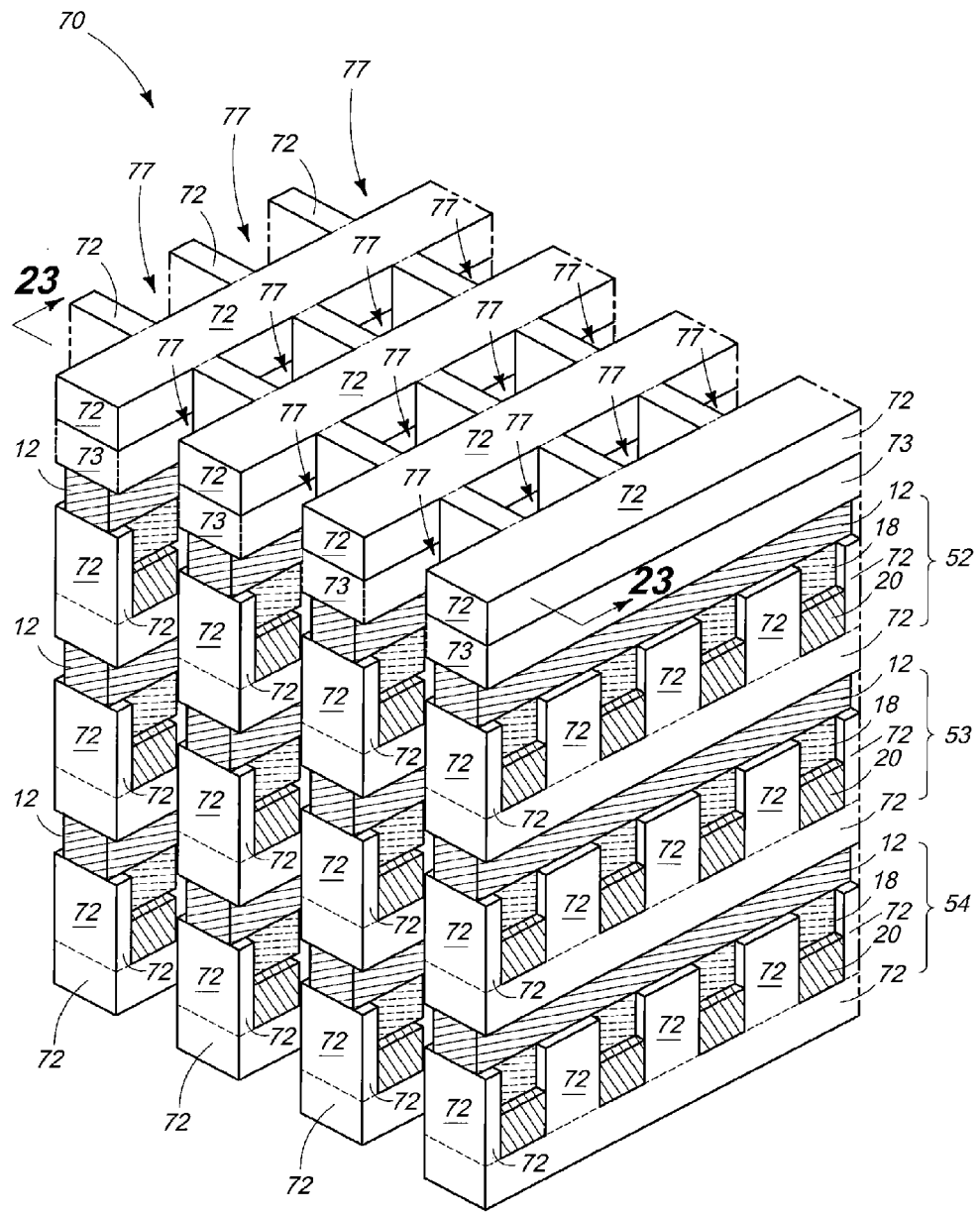
Figure 23:
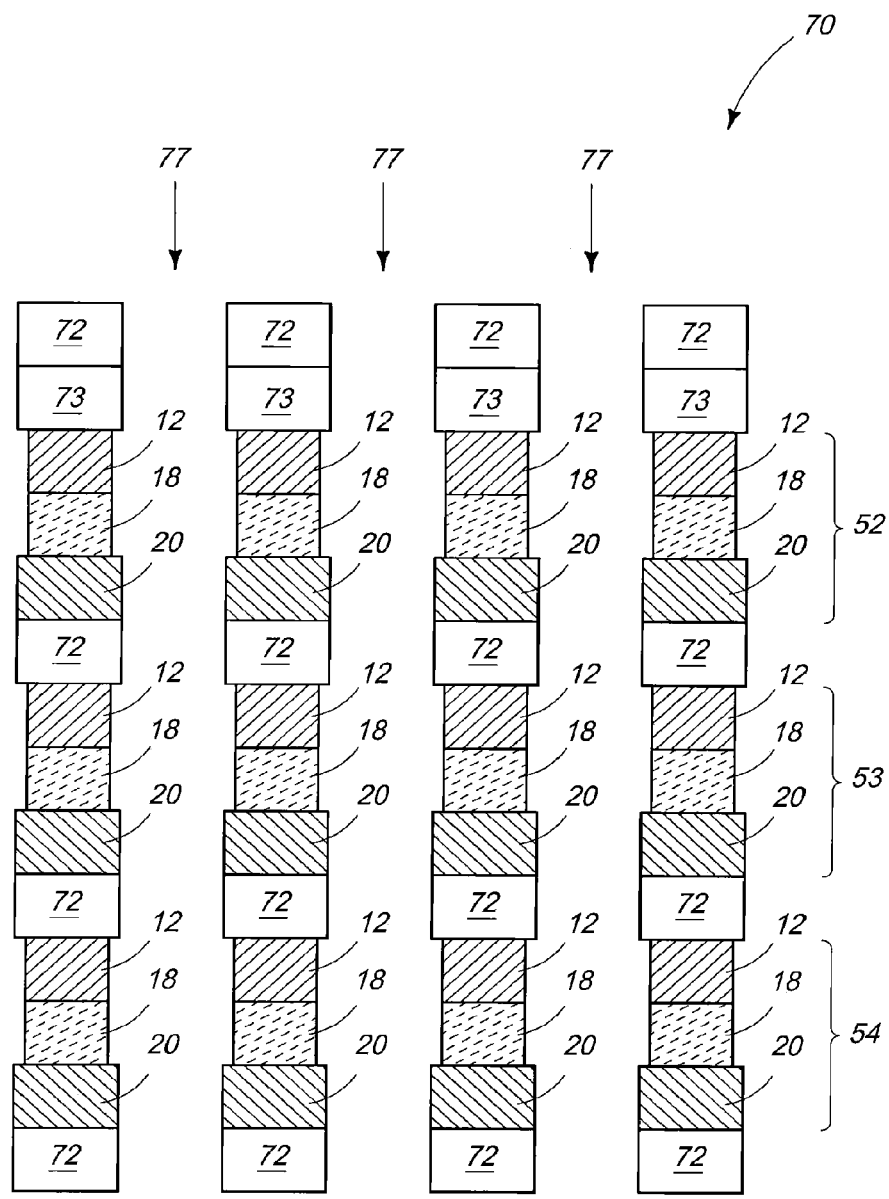

Referring to FIGS. 22 and 23, current conductive material 12 and select device or programmable material 18 have been isotropically etched selectively relative to materials 20, 72, and 73. Such may form components/material 12 and 18 into their finished final construction shapes, with conductive material 20 also being of its final construction shape.

Figure 24:
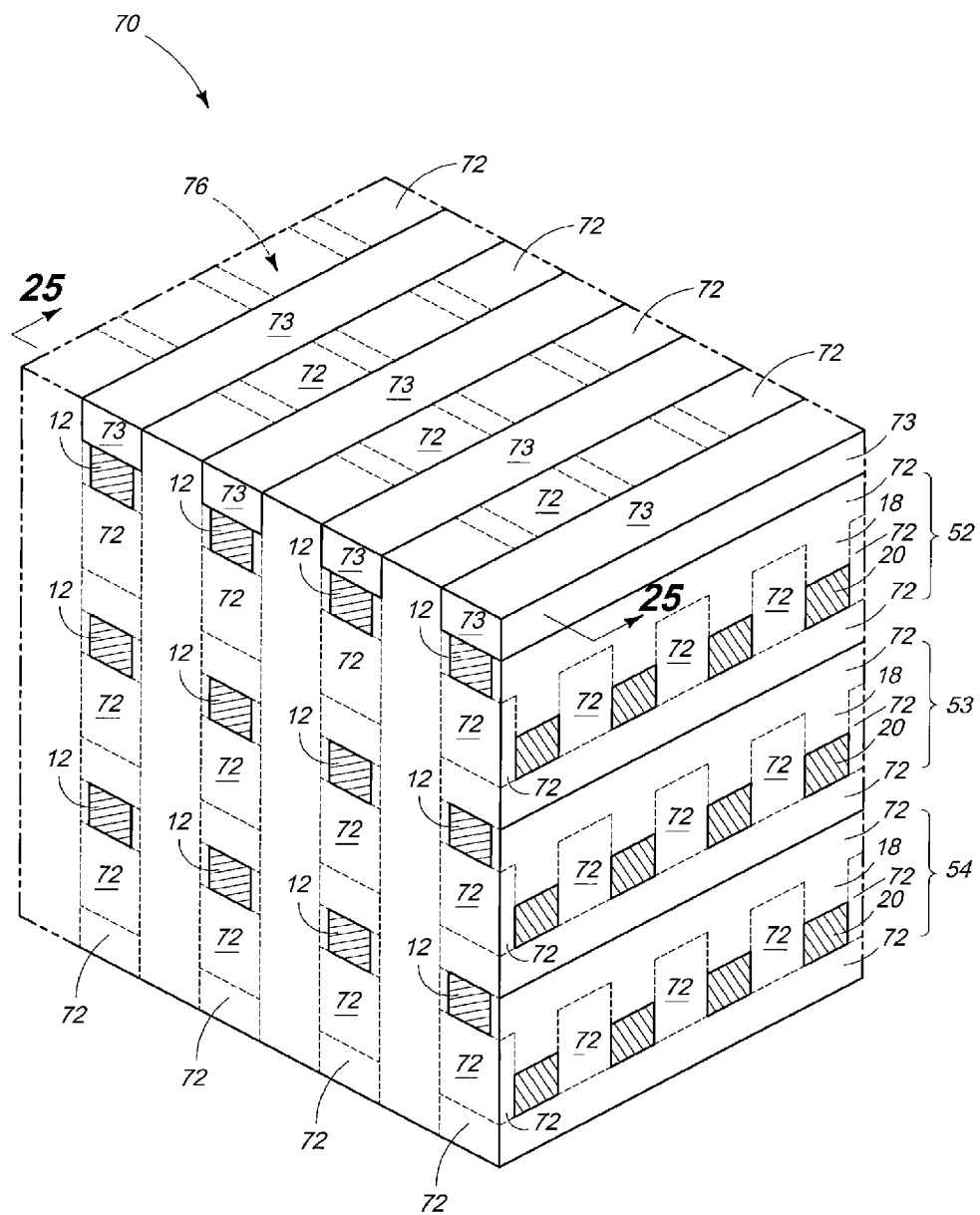
Figure 25:
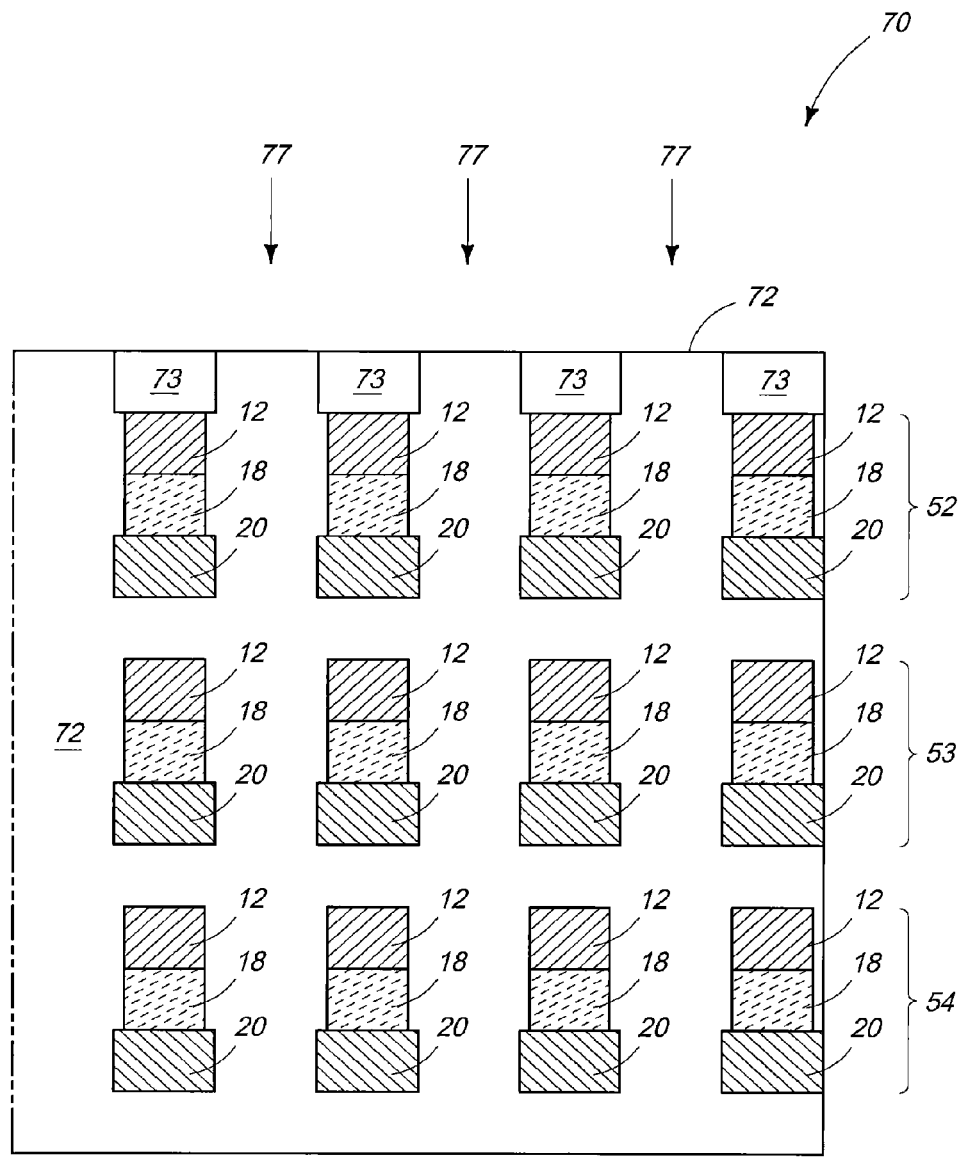

Referring to FIGS. 24 and 25, dielectric material has again been deposited, thus filling openings 77. In one embodiment, such may be of the same composition as dielectric 72 referred to above and is therefore so designated in the figures. Such may be planarized back as shown.

Figure 26:
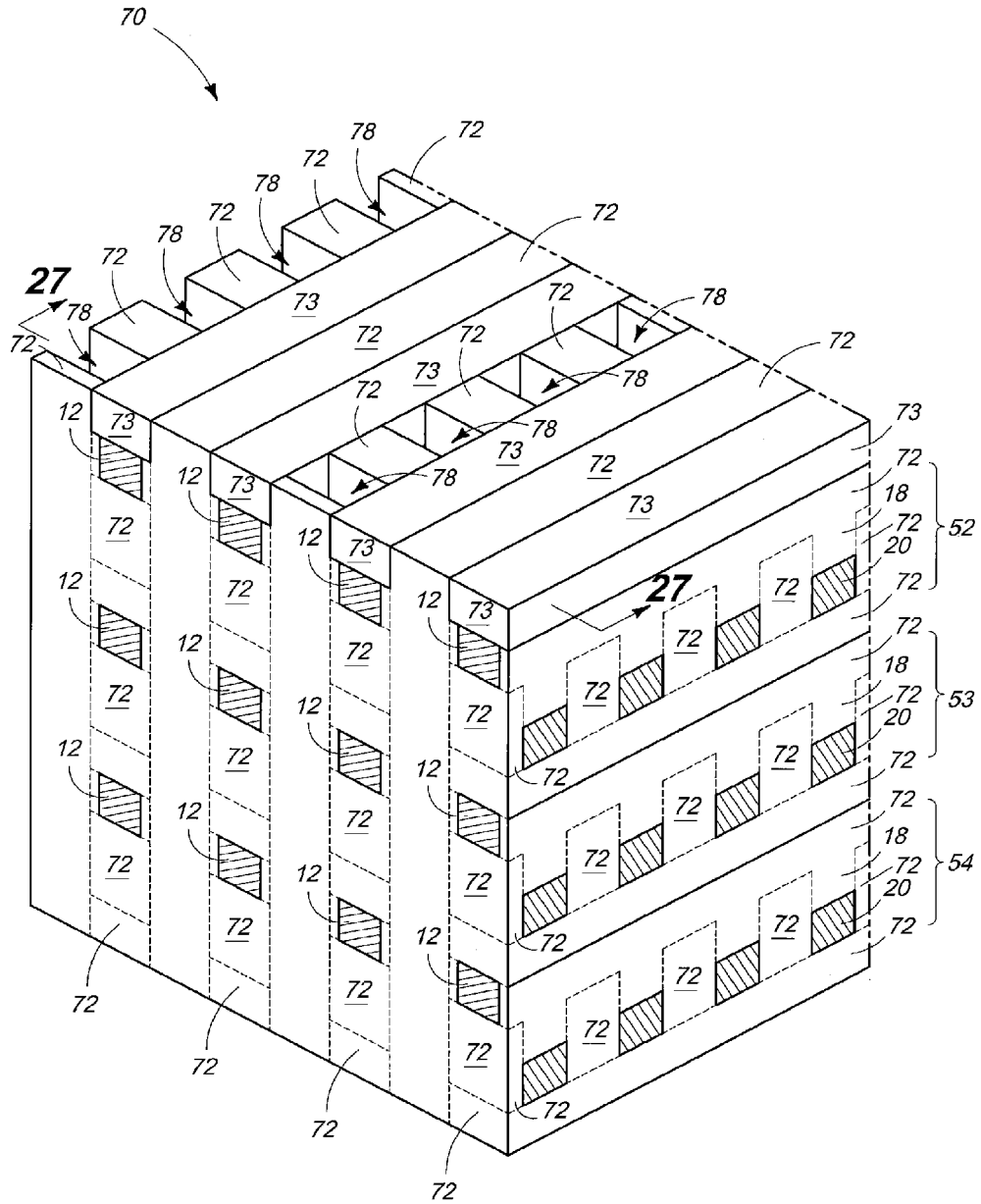
Figure 27:
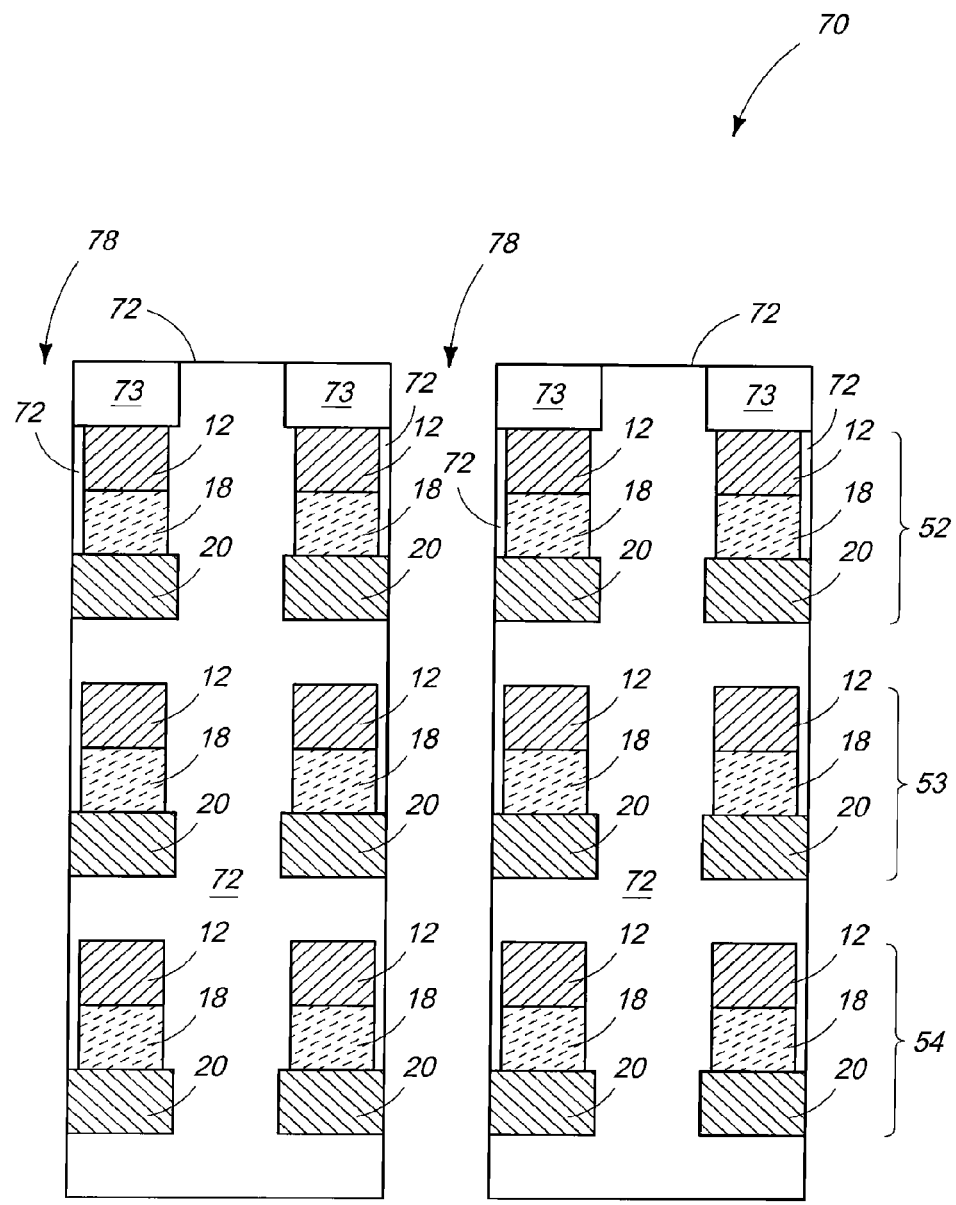

Referring to FIGS. 26 and 27, openings 78 have been formed through material 72. Such will comprise vertical columns within which the other of programmable material or select device material 16 and current conductive electrode material 14 will be formed.

Figure 28:
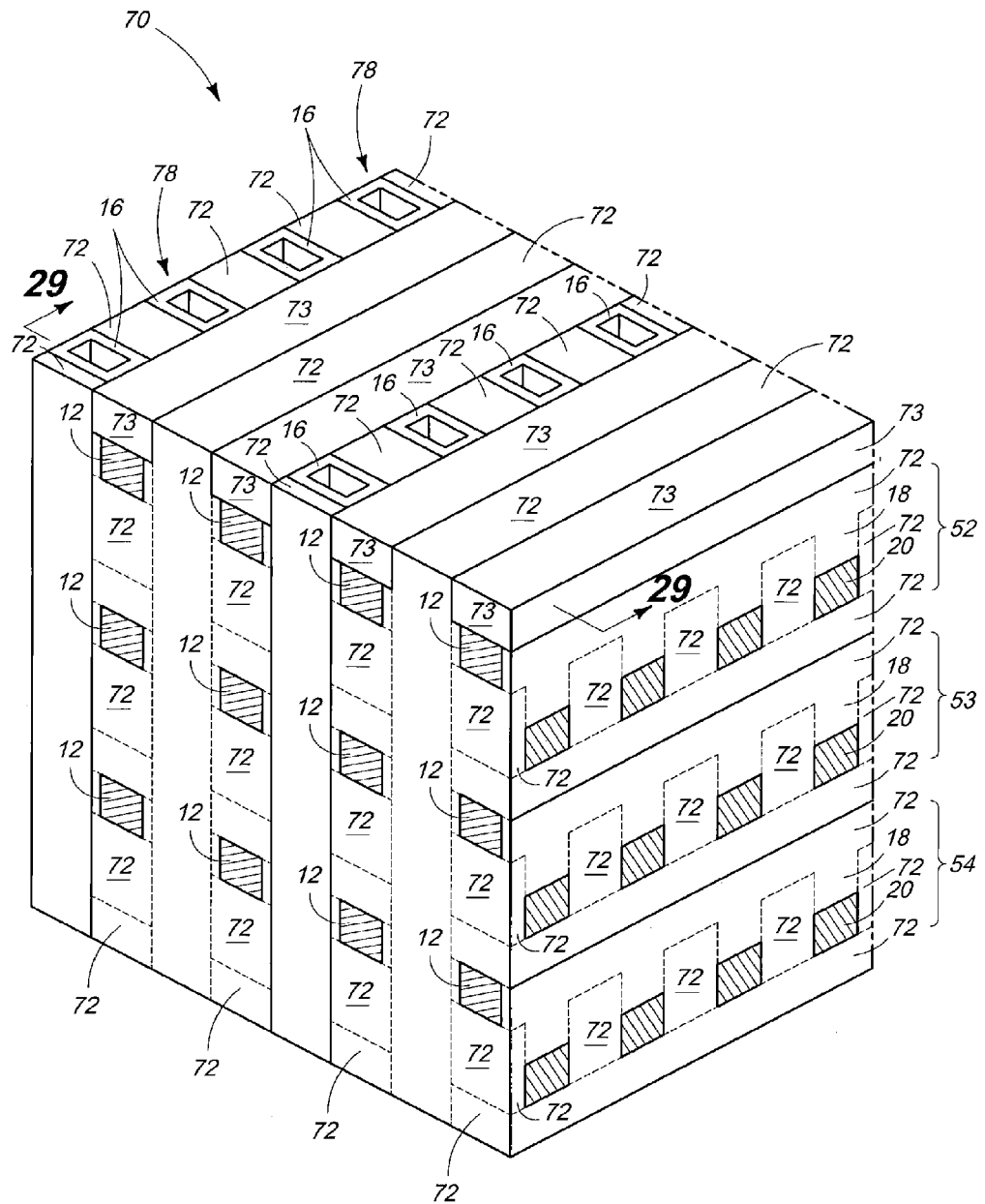
Figure 29:
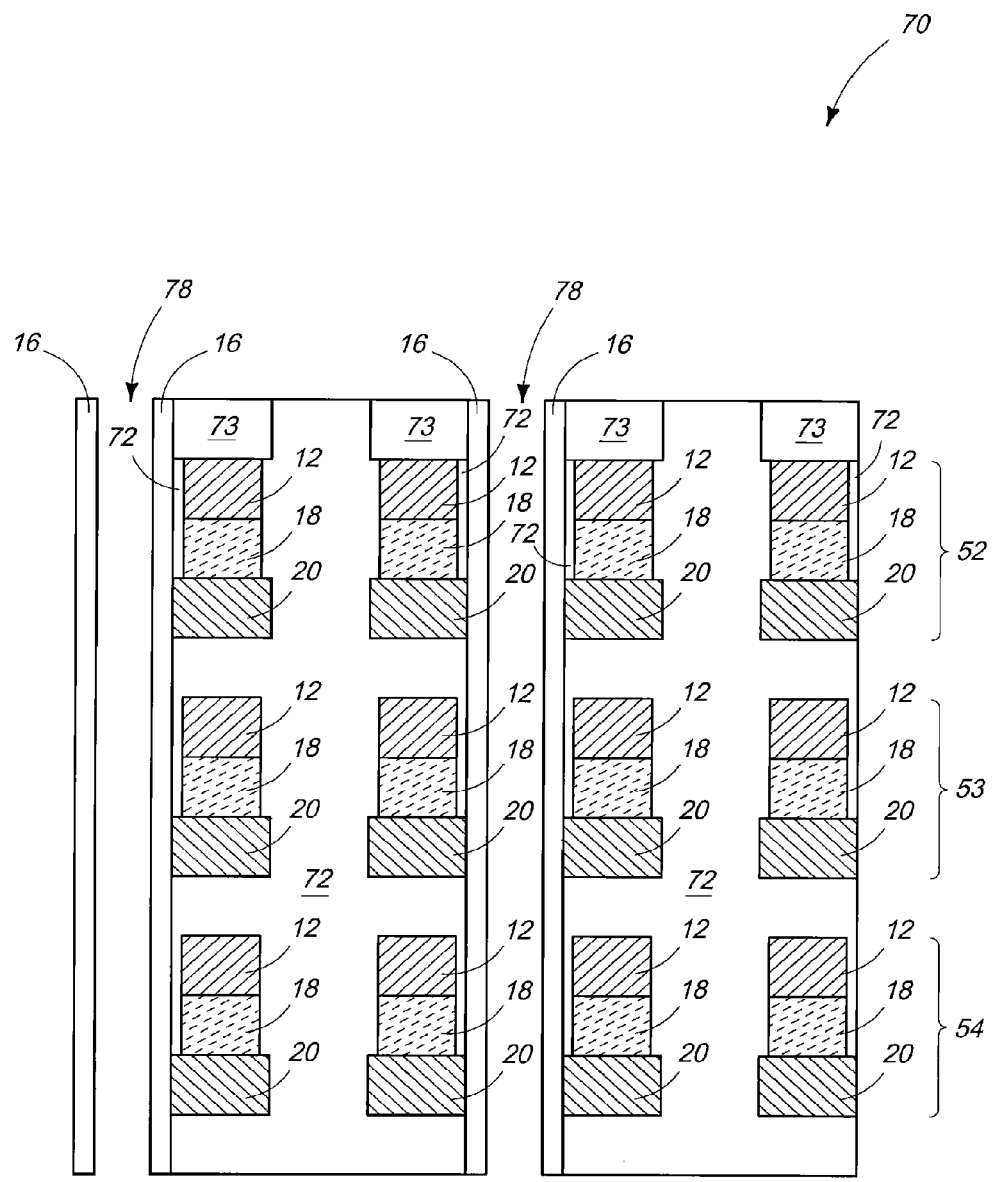

Referring to FIGS. 28 and 29, material 16 has been deposited to form a ring lining within openings 78 of FIGS. 26 and 27.

Figure 30:
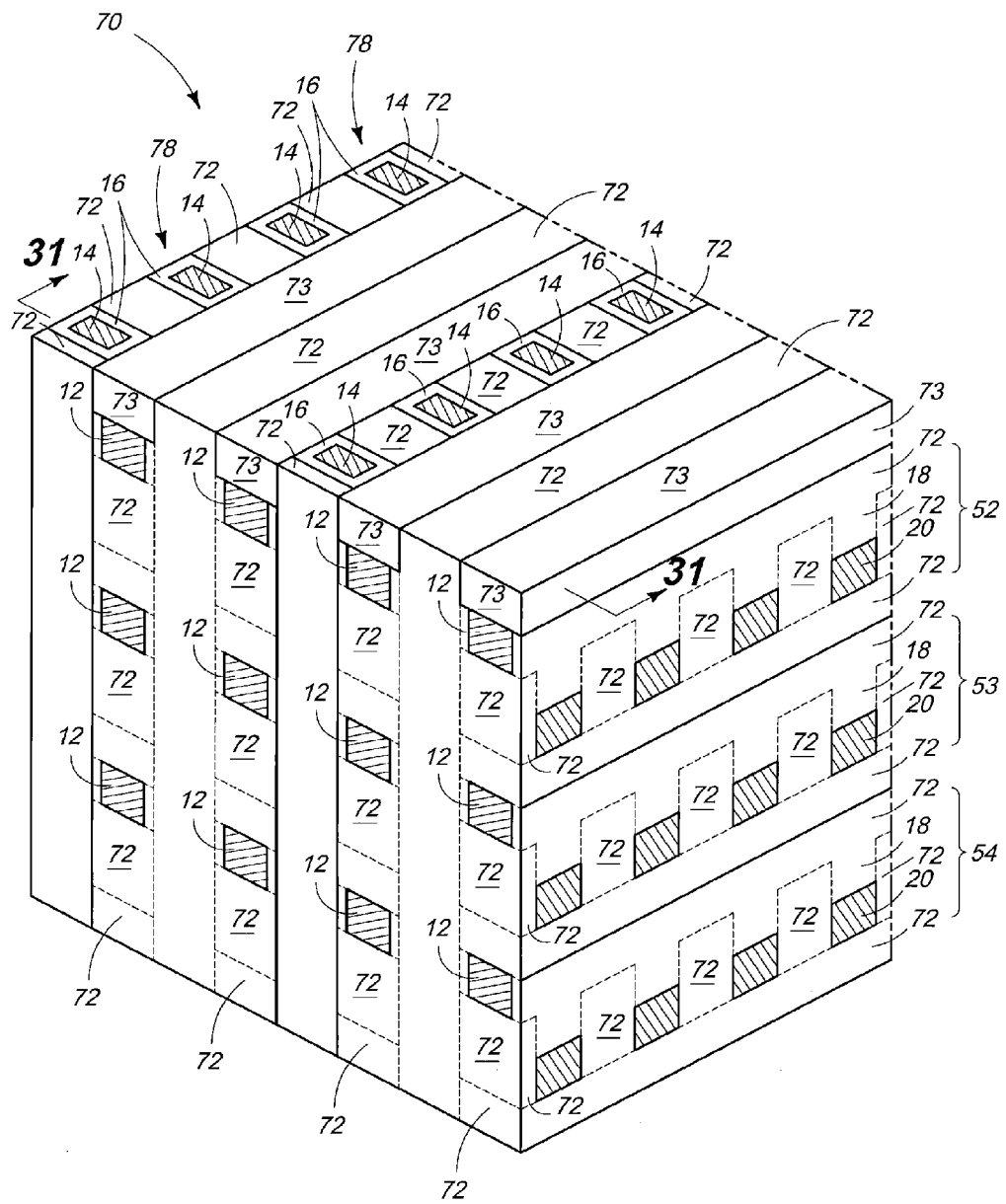
Figure 31:
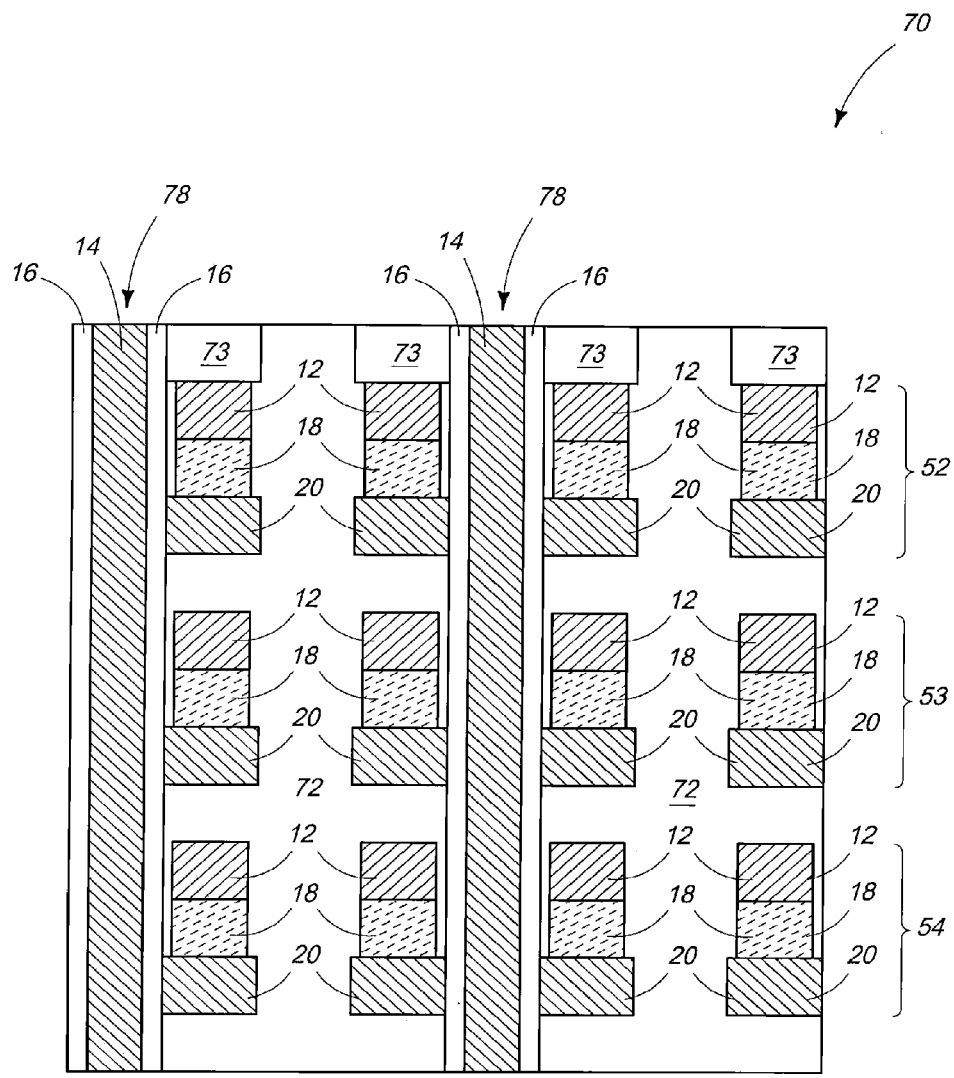

Referring to FIGS. 30 and 31, current conductive material 14 has been deposited within the remaining volume of openings 78 radially within the material 16 lining and subsequently planarized back, thus substantially completing the construction of array 70. Global second electrode lines (not shown) might have previously been formed elevationally inward of innermost layer 72. Alternately by way of example, such may be formed elevationally outward of the construction of FIGS. 30 and 31, and correspondingly patterned into global second electrode lines (not shown) in connection with individual of local vertical second electrode line extensions 14.

Corresponding or other processing methods to that of FIGS. 6-31 may be used for fabricating array 50a of FIG. 5.

Embodiments of the invention also encompass methods of forming an array of vertically stacked tiers of non-volatile memory cells. In one such embodiment, horizontally oriented and laterally overlapping first, second, and third lines are formed within individual tiers of a plurality of vertically stacked tiers. The first and third lines are current conductive and of different composition so that at least one of such may be selectively etched relative to the other. The second lines are respectively received between a respective first line and third line, and may comprise one of programmable material or select device material. By way of example only and with respect to FIGS. 10 and 11, example individual tiers 52, 53, 54 have respective first lines 12, second lines 18, and third lines 20 so formed. In one embodiment, the first line is received elevationally outward of the third line. In one embodiment, the first, second, and third lines are laterally coincident within the individual tiers.

Pairs of vertically extending and longitudinally aligned first openings are formed through a plurality of the tiers on laterally opposing sides of the first, second, and third lines within the individual tiers. By way of example only and with respect to FIGS. 12 and 13, individual such vertically extending and longitudinally aligned first openings of an example such pair are designated as 76b.

The second and third lines are laterally etched through selectively relative to the first lines between the respective pairs of first openings to form longitudinally spaced masses which extend vertically relative to the first lines. The masses respectively comprise material of the former second and third lines. By way of example only and with respect to FIGS. 14-16, such depicts example such lateral etching of the construction of FIGS. 12 and 13 to form longitudinally spaced masses 80 which extend vertically, in one embodiment and as shown vertically inward, relative to first lines 12. In one embodiment and as shown, the lateral etching may also longitudinally recess masses 80 relative to the respective pairs of first openings 76b.

Opposing sides of the first lines and the second line material of the masses are laterally recessed selectively relative to the third line material of the masses. Such is shown by way of example only in the processing of the substrate of the FIGS. 20 and 21 construction to produce that of FIGS. 22 and 23. Such may be conducted in one or more steps using any suitable wet or dry etching chemistry or chemistries. Dielectric material is subsequently formed laterally over the laterally recessed opposing sides of the first lines and the second line material of the masses, for example as shown in FIGS. 24 and 25 by deposition of material 72.

Vertically extending second openings are formed through the plurality of tiers. Individual of the second openings are laterally adjacent the dielectric material received over the laterally recessed first lines and second line material, and laterally adjacent third line material of individual of the masses within the individual tiers. By way of example only and with respect to FIGS. 26 and 27, openings 78 constitutes such example second openings.

A ring lining of the other of programmable material or select device material is formed within the second openings in current conductive connection with the third line material of individual of the masses within individual of the tiers. By way of example only and with respect to FIGS. 28 and 29, ring lining 16 is an example. Current conductive material is ultimately formed within the second openings radially within the ring lining, with FIGS. 30 and 31 being such an example with respect to material 14.

In one embodiment, a method of forming an array of vertically stacked tiers of non-volatile memory cells comprises forming horizontally oriented and laterally overlapping first, second, and third lines within individual tiers of a plurality of vertically stacked tiers. The first and third lines are current conductive and of different composition. The second line is received between the first and third lines, and is of a material different in composition from that of the first and third lines. Pairs of vertically extending and longitudinally aligned first openings are formed through the plurality of tiers on laterally opposing sides of the first, second, and third lines within the individual tiers.

Lateral etching is conducted through the second and third lines selectively relative to the first lines between the respective pairs of first openings to form longitudinally spaced masses which extend vertically relative to the first lines. The masses respectively comprise material of the former second and third lines.

Vertically extending second openings are formed through the plurality of tiers. Individual of the second openings are laterally spaced from opposing sides of the first lines and the second line of material of the masses. Individual of the second openings also laterally expose the third line material of individual of the masses within the individual tiers. Current conductive material is formed within the second openings ultimately, and regardless of whether programmable material and/or select device material are received laterally between the current conductive material and third line material of the individual masses. Other attributes as described above, or otherwise, may be employed.

An embodiment of a method of forming an array of vertically stacked tiers of non-volatile memory cells includes forming horizontally oriented current conductive lines having longitudinally spaced masses extending vertically therefrom. The masses respectively comprise current conductive material and other material received between the current conductive material and the current conductive line. The other material is of different composition from that of the current conductive material and the current conductive line. The processing as described above at least through FIGS. 13 and 14 is but one example, and regardless of composition of example other material 20.

Opposing sides of the horizontally oriented current conductive lines and the other material of the masses are laterally recessed selectively relative to the current conductive material of the masses. FIGS. 22 and 23 depict one such example.

Dielectric material is formed laterally over the laterally recessed opposing sides of the horizontally oriented current conductive lines and the other material of the masses. Vertically extending openings are formed through the plurality of tiers. Individual of the openings are laterally adjacent the dielectric material received over the laterally recessed opposing sides of the current conductive lines and other material of the masses. Individual of the openings also laterally expose the current conductive material of individual of the masses within the individual tiers. Ultimately, current conductive material is formed within the openings. Attributes of any of the methods described above, or otherwise, may be employed.

In one embodiment, a method of forming an array of vertically stacked tiers of non-volatile memory cells includes forming horizontally oriented current conductive lines having longitudinally spaced masses extending vertically therefrom. The masses respectively comprise current conductive material and other material received between the current conductive material and the current conductive line. The other material is of different composition from that of the current conductive material and the current conductive line.

Vertically extending openings are formed through the plurality of tiers. Individual of such openings are laterally spaced from opposing sides of the horizontally oriented current conductive lines and the other material of the masses. Individual of the second openings laterally expose the current conductive material of individual of the masses within the individual tiers.

A ring lining is formed of programmable material or select device material within the openings in current conductive connection with the current conductive material of individual of the masses within individual of the tiers. Ultimately, current conductive material is formed within the openings radially within the ring lining. Other attributes as described above, or otherwise, may be employed.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of vertically stacked tiers of nonvolatile memory cells, comprising:
   a plurality of horizontally oriented first electrode lines within individual tiers of memory cells;
   a plurality of horizontally oriented global second electrode lines having local vertical second electrode line extensions extending through multiple of the tiers of memory cells; and
   individual of the memory cells comprising:
      a crossing one of the horizontal first electrode lines and one of the local vertical second electrode line extensions;
      programmable material, a select device in series with the programmable material, and current conductive material in series between and with the programmable material and the select device; the programmable material and the select device being in series with such crossing ones of the horizontal first electrode lines and local vertical second electrode line extensions; and
      the programmable material and the select device are oriented for predominant current flow into or out of the crossing one local vertical second electrode line extension out of or into, respectively, one of the programmable material or select device in a horizontal direction, and for predominant current flow into or out of the crossing one horizontal electrode line out of or into, respectively, the other of the programmable material and select device in a vertical direction.

2. The array of claim 1 wherein the first electrode lines are data/sense lines and the second electrode lines are access lines, and the programmable material and the select device are oriented for predominant current flow out of the one data/sense line and into the other of the programmable material or select device in an elevationally inward vertical direction.

3. The array of claim 1 wherein the first electrode lines are data/sense lines and the second electrode lines are access lines, and the programmable material and the select device are oriented for predominant current flow out of the one data/sense line and into the other of the programmable mat.

4. The array of claim 1 wherein the select device is directly against the respective local vertical second electrode line extensions.

5. The array of claim 1 wherein the select device is directly against the respective first electrode lines.

6. The array of claim 5 wherein the first electrode lines have respective elevationally outermost surfaces, the respective select devices being directly against said respective elevationally outermost surfaces.

7. The array of claim 5 wherein the first electrode lines have respective elevationally innermost surfaces, the respective select devices being directly against said respective elevationally innermost surfaces.

8. The array of claim 1 wherein the programmable material is directly against the respective local vertical second electrode line extensions.

9. The array of claim 1 wherein the programmable material is directly against the respective first electrode lines.

10. The array of claim 9 wherein the first electrode lines have respective elevationally outermost surfaces, the programmable material being directly against said respective elevationally outermost surfaces.

11. The array of claim 9 wherein the first electrode lines have respective elevationally innermost surfaces, the programmable material being directly against said respective elevationally innermost surfaces.

12. The array of claim 1 wherein the programmable material and the select device are directly against the current conductive material.

13. The array of claim 12 wherein the respective select devices are directly against respective ones of the horizontal first electrode lines or local vertical second electrode line extensions, and the programmable material is directly against respective others of the horizontal first electrode lines and local vertical second electrode line extensions.

14. The array of claim 1 wherein,
   the first electrode lines are data/sense lines and the second electrode lines are access lines;
   the individual vertical tiers of memory cells respectively comprise an elevationally outer tier and an elevationally inner tier of respective pluralities of horizontally oriented data/sense lines; and the respective select devices comprise a first diode directly against an elevationally outermost surface of said current conductive material and which is in series current conductive connection with one of the horizontally oriented data/sense lines of the respective elevationally outer tiers; and further comprising:

a second diode directly against an elevationally innermost surface of said current conductive material and which is in series current conductive connection with one of the horizontally oriented data/sense lines of the respective elevationally inner tier.

15. The array of claim 14 wherein the respective first diodes are directly against an elevationally innermost surface of the respective ones of the horizontally oriented data/sense lines of the respective elevationally outer tiers.

16. The array of claim 14 wherein the respective second diodes are directly against an elevationally outermost surface of the respective ones of the horizontally oriented data/sense lines of the respective elevationally inner tiers.

17. The array of claim 14 wherein, the respective first diodes are directly against an elevationally innermost surface of the respective ones of the horizontally oriented data/sense lines of the respective elevationally outer tiers; and the respective second diodes are directly against an elevationally outermost surface of the respective ones of the horizontally oriented data/sense lines of the respective elevationally inner tiers.

18. The array of claim 17 wherein the programmable material is directly against both the respective local vertical access line extensions and current conductive material.

19. The array of claim 1 wherein the programmable material comprises memristive material.

20. The array of claim 1 wherein the programmable material comprises multi-resistive state metal oxide-comprising material.

21. The array of claim 1 wherein the programmable material comprises ion conductive material.

22. The array of claim 1 wherein the first electrode lines are oriented perpendicularly relative to the second electrode lines.

* * * * *

UNITED STATES PATENT AND TRADEMARK OFFICE
CERTIFICATE OF CORRECTION

PATENT NO. : 9,093,368 B2
APPLICATION NO. : 13/950026
DATED : July 28, 2015
INVENTOR(S) : Zengtao T. Liu and David H. Wells Page 1 of 1

It is certified that error appears in the above-identified patent and that said Letters Patent is hereby corrected as shown below:

Col. 12, line 25, claim 3, please delete "mat" after "programmable" and insert --material.--

Signed and Sealed this
Twenty-second Day of March, 2016

Michelle K. Lee
*Director of the United States Patent and Trademark Office*